(12) United States Patent
Iwata et al.

(10) Patent No.: US 11,258,973 B2
(45) Date of Patent: Feb. 22, 2022

(54) AD CONVERSION CIRCUIT, PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventors: Koichiro Iwata, Kawasaki (JP); Yoshiaki Takada, Kawasaki (JP); Kohichi Nakamura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/001,323

(22) Filed: Aug. 24, 2020

(65) Prior Publication Data
US 2021/0067724 A1 Mar. 4, 2021

(30) Foreign Application Priority Data
Aug. 28, 2019 (JP) .............................. JP2019-155626

(51) Int. Cl.
| | |
|---|---|
| H04N 5/374 | (2011.01) |
| H04N 5/3745 | (2011.01) |
| H03M 1/56 | (2006.01) |
| H04N 5/376 | (2011.01) |
| H04N 5/378 | (2011.01) |

(52) U.S. Cl.
CPC .......... H04N 5/37455 (2013.01); H03M 1/56 (2013.01); H04N 5/378 (2013.01); H04N 5/3765 (2013.01)

(58) Field of Classification Search
CPC .................................................. H04N 5/37455
USPC ......................................................... 348/294
See application file for complete search history.

(56) References Cited

U.S. PATENT DOCUMENTS

| | | | |
|---|---|---|---|
| 2010/0253560 A1 | 10/2010 | Kudo | |
| 2011/0001039 A1* | 1/2011 | Hoshino | .............. H04N 5/3742 250/208.1 |
| 2016/0021323 A1 | 1/2016 | Yasutoshi | |

(Continued)

FOREIGN PATENT DOCUMENTS

| | | |
|---|---|---|
| JP | 2004-159274 A | 6/2004 |
| JP | 2010-259051 A | 11/2010 |
| JP | 2013-150121 A | 8/2013 |

(Continued)

*Primary Examiner* — Joel W Fosselman
(74) *Attorney, Agent, or Firm* — Canon U.S.A., Inc. IP Division

(57) ABSTRACT

An AD conversion circuit includes a comparator configured to compare an analog signal with a ramp signal and output a comparison result signal indicating a result of the comparison, and performs an AD conversion using the comparison result signal. In the comparison, a potential of the ramp signal changes with a lapse of time from a first potential to a second potential. Before the comparison, the potential of the ramp signal changes at a first change rate and then changes at a second change rate smaller than the first change rate, the potential of the ramp signal changes from the first potential to a third potential between the first potential and the second potential, and the comparator is reset in a state where the third potential is input to the comparator.

36 Claims, 14 Drawing Sheets

(56) References Cited

U.S. PATENT DOCUMENTS

2017/0064237 A1   3/2017  Yasutoshi
2017/0374264 A1   12/2017 Yasutoshi

FOREIGN PATENT DOCUMENTS

| JP | 2016-025427 A | 2/2016 |
| JP | 2017-046259 A | 3/2017 |
| JP | 2018-093480 A | 6/2018 |
| WO | 18/096955 A1 | 5/2018 |

* cited by examiner

FIG.12

| COUNT VALUE | P1 | P2 | P3 | CURRENT VALUE |
|---|---|---|---|---|
| 0 | Lo | Lo | Lo | 0 |
| 1 | Hi | Lo | Lo | Ib |
| 2 | Lo | Hi | Lo | 2·Ib |
| 3 | Hi | Hi | Lo | 3·Ib |
| 4 | Lo | Lo | Hi | 4·Ib |
| 5 | Hi | Lo | Hi | 5·Ib |
| 6 | Lo | Hi | Hi | 6·Ib |
| 7 | Hi | Hi | Hi | 7·Ib |

AD CONVERSION CIRCUIT, PHOTOELECTRIC CONVERSION APPARATUS, PHOTOELECTRIC CONVERSION SYSTEM, AND MOVING BODY

BACKGROUND OF THE DISCLOSURE

Field of the Disclosure

The aspect of the embodiments relates to an analog-to-digital (AD) conversion circuit, a photoelectric conversion apparatus, a photoelectric conversion system, and a moving body.

Description of the Related Art

An analog-to-digital (AD) conversion circuit is known that converts an analog signal into a digital signal using a reference signal (ramp signal) whose potential changes with a lapse of time.

Japanese Patent Laid-Open No. 2013-150121 discusses a technique for resetting a comparator in a state where a potential (offset potential) obtained by offsetting a reference signal from an initial potential is input to the comparator. According to this technique, an operating point at which a signal output from the comparator during AD conversion changes is set. Further, the reference signal is set to the initial potential again and the potential is changed with a lapse of time from the initial potential (a ramp signal is generated), thereby performing an AD conversion.

SUMMARY OF THE DISCLOSURE

According to an aspect of the embodiments, an analog-to-digital (AD) conversion circuit is provided, the circuit comprising a comparator configured to compare an analog signal with a ramp signal and output a comparison result signal indicating a result of the comparison, and performing an AD conversion using the comparison result signal to convert the analog signal into a digital signal, wherein in the comparison, a potential of the ramp signal changes with a lapse of time from a first potential to a second potential, and wherein before the comparison, the potential of the ramp signal changes at a first change rate and then changes at a second change rate smaller than the first change rate, the potential of the ramp signal changes from the first potential to a third potential between the first potential and the second potential, and the comparator is reset in a state where the third potential is input to the comparator.

According to another aspect of the embodiments, an AD conversion circuit is provided, the circuit comprising a comparator configured to compare an analog signal with a ramp signal and output a comparison result signal indicating a result of the comparison, and performing an AD conversion using the comparison result signal to convert the analog signal into a digital signal, wherein in the comparison, a potential of the ramp signal changes with a lapse of time from a first potential to a second potential, wherein before the comparison, the comparator is reset in a state where a third potential is input to the comparator, the third potential being a voltage between the first potential and the second potential, and wherein in the comparison, during the change of the potential of the ramp signal from the first potential to the third potential, the potential of the ramp signal changes at a first change rate and then changes at a second change rate smaller than the first change rate.

Further features of the disclosure will become apparent from the following description of exemplary embodiments with reference to the attached drawings.

BRIEF DESCRIPTION OF THE DRAWINGS

FIG. 12 is a table illustrating relationships among a count value of a counter, control signals, and a value of a current flowing through a resistive element.

DESCRIPTION OF THE EMBODIMENTS

In the technique discussed in Japanese Patent Laid-Open No. 2013-150121, a voltage range of a reference signal from a predetermined potential to a potential at which a comparator is reset is a region in which a signal output from the comparator during an analog-to-digital (AD) conversion does not change. Accordingly, there is a room for reducing an AD conversion period or a period for resetting the comparator. The following exemplary embodiments relate to a technique for reducing the AD conversion period or the period for resetting the comparator.

Exemplary embodiments will be described below with reference to the drawings.

In the following exemplary embodiments, an image capturing apparatus is mainly described as an example of a photoelectric conversion apparatus according to the disclosure. However, the exemplary embodiments are not limited to the image capturing apparatus and can also be applied to other examples of the photoelectric conversion apparatus. Examples of the photoelectric conversion apparatus include a ranging apparatus (apparatus for, for example, distance measurement using focus detection or Time-Of-Flight (TOF)), and a photometry apparatus (apparatus for, for example, measurement of the amount of incident light).

First Exemplary Embodiment

Figure 1:
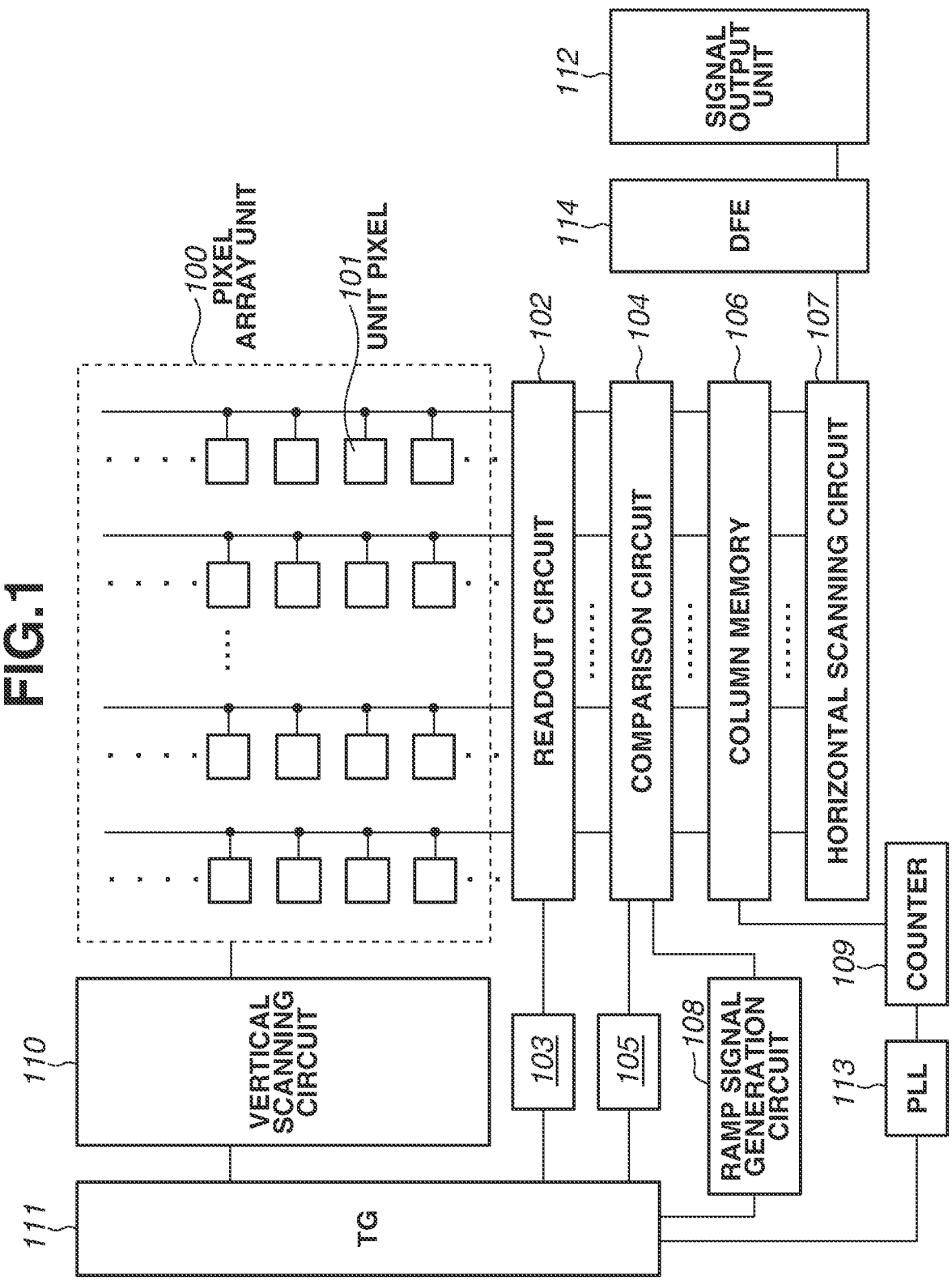
FIG. 1 is a block diagram illustrating a configuration of an image capturing apparatus as an example of a photoelectric conversion apparatus.

FIG. 1 is a block diagram illustrating a configuration of an image capturing apparatus according to a first exemplary embodiment.

The image capturing apparatus includes a pixel array unit 100. A plurality of pixels 101 is arranged in a plurality of rows and a plurality of columns in the pixel array unit 100. As described below, each of the plurality of unit pixels 101 is provided with a photoelectric conversion unit that receives incident light and generates signal charges. The pixel array unit 100 is provided with a plurality of signal lines arranged corresponding to the respective columns of the unit pixels 101. A vertical scanning circuit 110 selects the unit pixels 101 for each row. Each unit pixel 101 located in the row selected by the vertical scanning circuit 110 outputs a pixel signal based on the signal charges to the corresponding signal line.

The image capturing apparatus further includes a readout circuit 102. The readout circuit 102 supplies a current to each signal line for reading out signals from the unit pixels 101. Further, the readout circuit 102 supplies a current to each signal line and performs signal processing on the pixel signal output from each unit pixel 101 through the corresponding signal line. Examples of the signal processing performed by the readout circuit 102 include signal amplification, noise reduction in signals (correlated double sampling), and sampling and holding.

The image capturing apparatus further includes a first bias supply circuit 103. The first bias supply circuit 103 supplies the readout circuit 102 with a voltage and current.

The image capturing apparatus further includes a comparison circuit 104, a second bias supply circuit 105, a column memory 106, a horizontal scanning circuit 107, a ramp signal generation circuit 108, and a counter 109. The second bias supply circuit 105 supplies the comparison circuit 104 with a voltage and current. The ramp signal generation circuit 108 generates a ramp signal whose potential changes with a lapse of time, and outputs the ramp signal to the comparison circuit 104. The comparison circuit 104 outputs a comparison result signal indicating a result of a comparison between the ramp signal and the pixel signal output from the readout circuit 102 to the column memory 106. The readout circuit 102 is an analog signal output unit that outputs the pixel signal, which is an analog signal, to the comparison circuit 104.

The counter 109 generates a count signal, which indicates a lapse of time, using pulse signals output from a phase-locked loop (PLL) circuit 113, and outputs the count signal to the column memory 106.

The column memory 106 holds the count signal output from the counter 109 based on a change of a signal level indicated by the comparison result signal output from the comparison circuit 104. Thus, the column memory 106 holds the count signal indicating a signal value corresponding to the value of the pixel signal as a digital signal corresponding to the pixel signal.

The horizontal scanning circuit 107 scans each column of the column memory 106 and reads out digital signals from the column memories, which are arranged corresponding to the respective columns of the unit pixels 101, into a digital front end (DFE) 114. The DFE 114 performs various kinds of digital signal processing, such as amplification, noise reduction, addition, and correction, on the read digital signals. The DFE 114 outputs the processed digital signals to a signal output circuit 112. The signal output circuit 112 outputs the digital signals to the outside of the image capturing apparatus.

The image capturing apparatus further includes a timing generator (TG) 111. The TG 111 outputs a control signal for controlling an operation to each of the vertical scanning circuit 110, the first bias supply circuit 103, the second bias supply circuit 105, the ramp signal generation circuit 108, and the PLL circuit 113.

Figure 2:
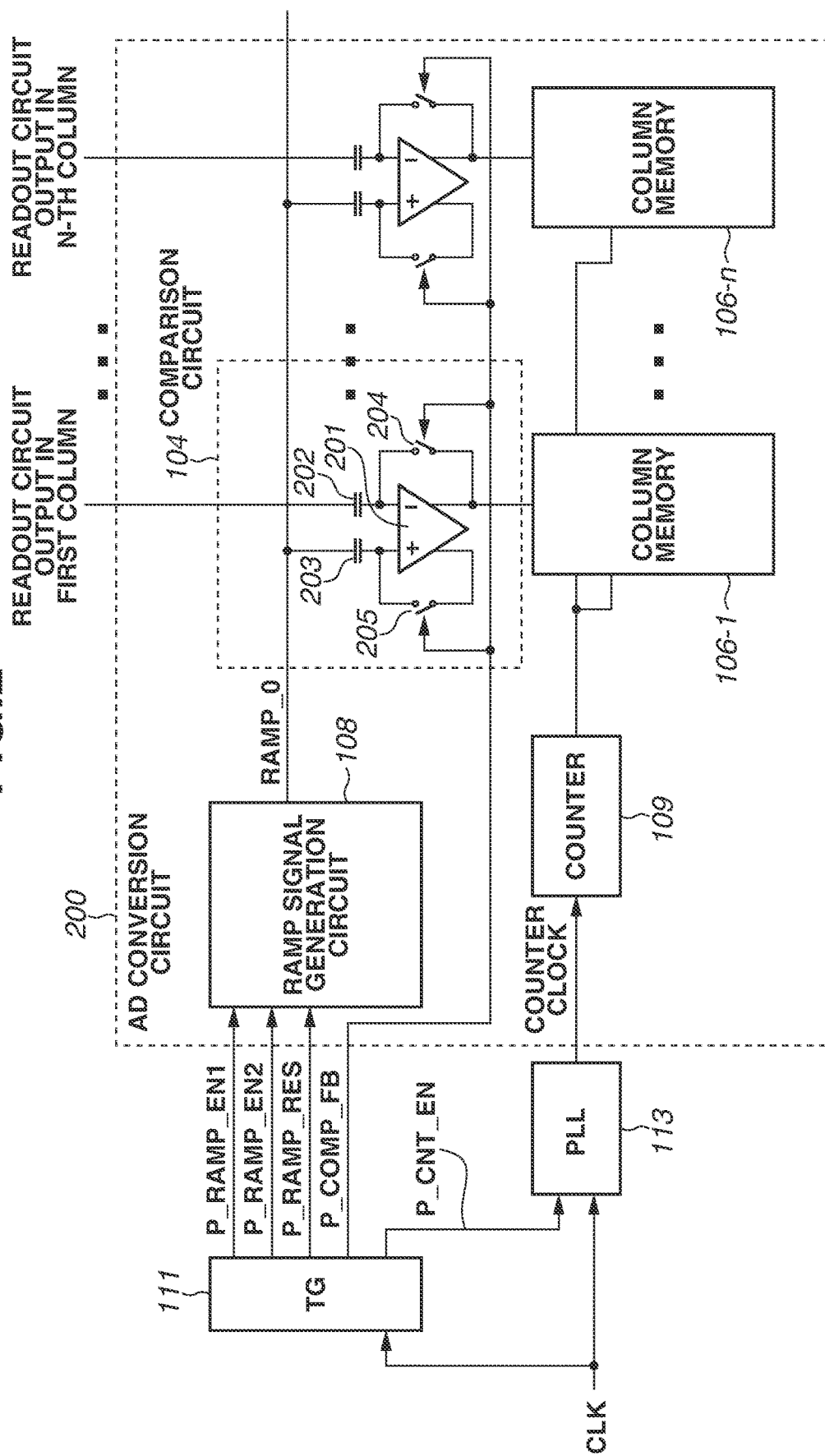
FIG. 2 is a block diagram illustrating a configuration including an analog-to-digital (AD) conversion circuit.

FIG. 2 is a block diagram illustrating a configuration including an AD conversion circuit 200. The AD conversion circuit 200 includes the comparison circuit 104, the column memory 106, and the ramp signal generation circuit 108, which are illustrated in FIG. 1. FIG. 2 illustrates not only the AD conversion circuit 200, but also the TG 111 and the PLL circuit 113.

Control signals P_RAMP_EN1, P_RAMP_EN2, and P_RAMP_RES are supplied to the ramp signal generation circuit 108 from the TG 111. The ramp signal generation circuit 108 supplies a reference signal RAMP_O to the comparison circuit 104. The comparison circuit 104 includes a comparator 201, capacitive elements 202 and 203, and switches 204 and 205. An inverting input terminal (first input terminal), which is one of input nodes of the comparator 201, receives the pixel signal through the capacitive element 202 (first capacitive element) from the readout circuit 102 in the corresponding column. A non-inverting input terminal (second input terminal), which is the other one of the input nodes of the comparator 201, receives the reference signal RAMP_O through the capacitive element 203 (second capacitive element).

The comparator 201 compares the pixel signal with the reference signal RAMP_O, and outputs the comparison result signal indicating the comparison result to the corresponding column memory 106-1.

The switches 204 and 205 are controlled by a signal P_COMP_FB input from the TG 111. When the switches 204 and 205 are turned on, charges of the capacitive elements 202 and 203 are reset to thereby reset the comparator 201.

Although the non-inverting input terminal and the inverting input terminal of the comparator 201 are not illustrated in FIG. 2, it is assumed that the pixel signal is input to one of the non-inverting input terminal and the inverting input terminal and the ramp signal is input to the other one of the non-inverting input terminal and the inverting input terminal.

The TG 111 and the PLL circuit 113 receive a clock signal CLK as a reference clock. The TG 111 supplies a control signal P_CNT_EN to the PLL circuit 113. The PLL circuit 113 supplies a pulse signal, which is a counter clock signal for operating the counter 109, to the counter 109. The counter 109 counts pulse signals as the counter clock signal to thereby generate the count signal. The counter 109 supplies the count signal to each of the column memories 106-1 to 106-n in the respective columns.

Figure 3:
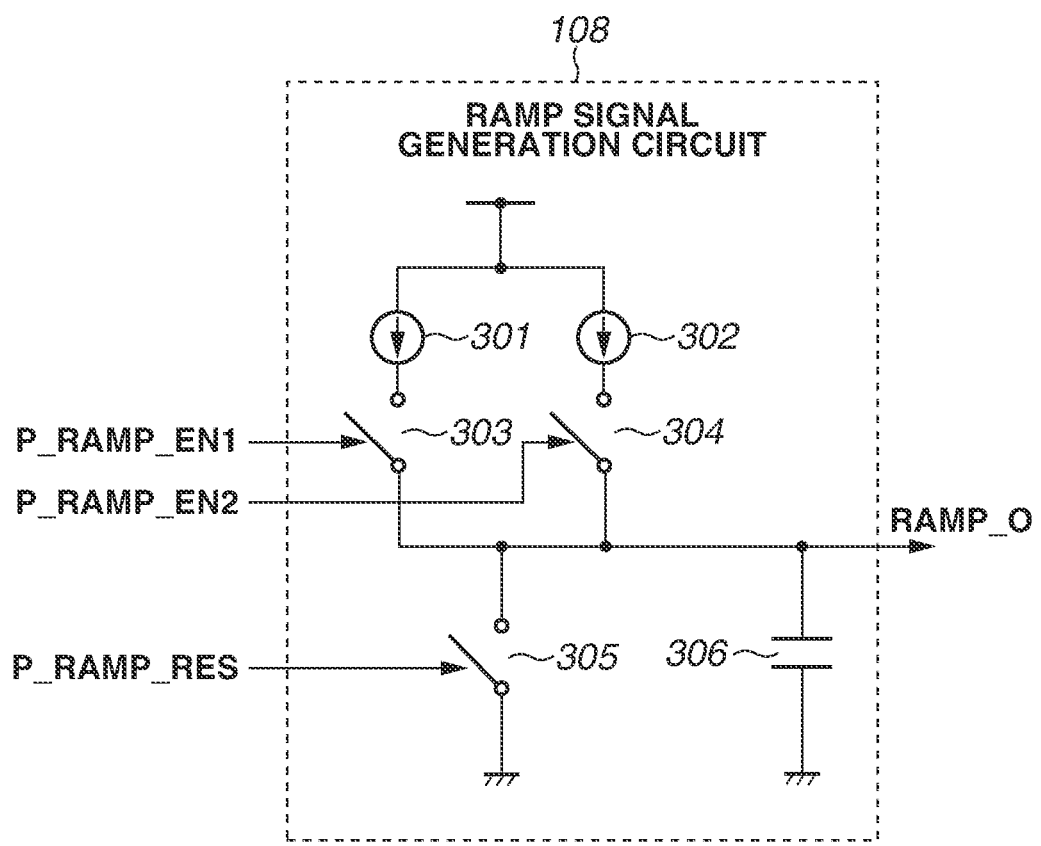
FIG. 3 is a circuit diagram illustrating a configuration of a ramp signal generation circuit.

FIG. 3 is a circuit diagram illustrating details of the ramp signal generation circuit 108.

Each of a first current source 301 and a second current source 302 is a variable current source in which the amount of current to be supplied is variable. Turning on/off of switches 303 and 304 is controlled by the control signals P_RAMP_EN1 and P_RAMP_EN2 supplied from the TG 111. A capacitive element 306 is charged by turning on one or both of the switches 303 and 304. The reference signal RAMP_O is generated by charging the capacitive element 306 with a current. Turning on/off of the switch 305 is controlled by the control signal P_RAMP_RES supplied from the TG 111. When the switch 305 is turned on, the charge of the capacitive element 306 is discharged to a ground electrode GND. Thus, the charge from the capacitive element 306 is reset to thereby reset the reference signal RAMP_O.

Figure 4:
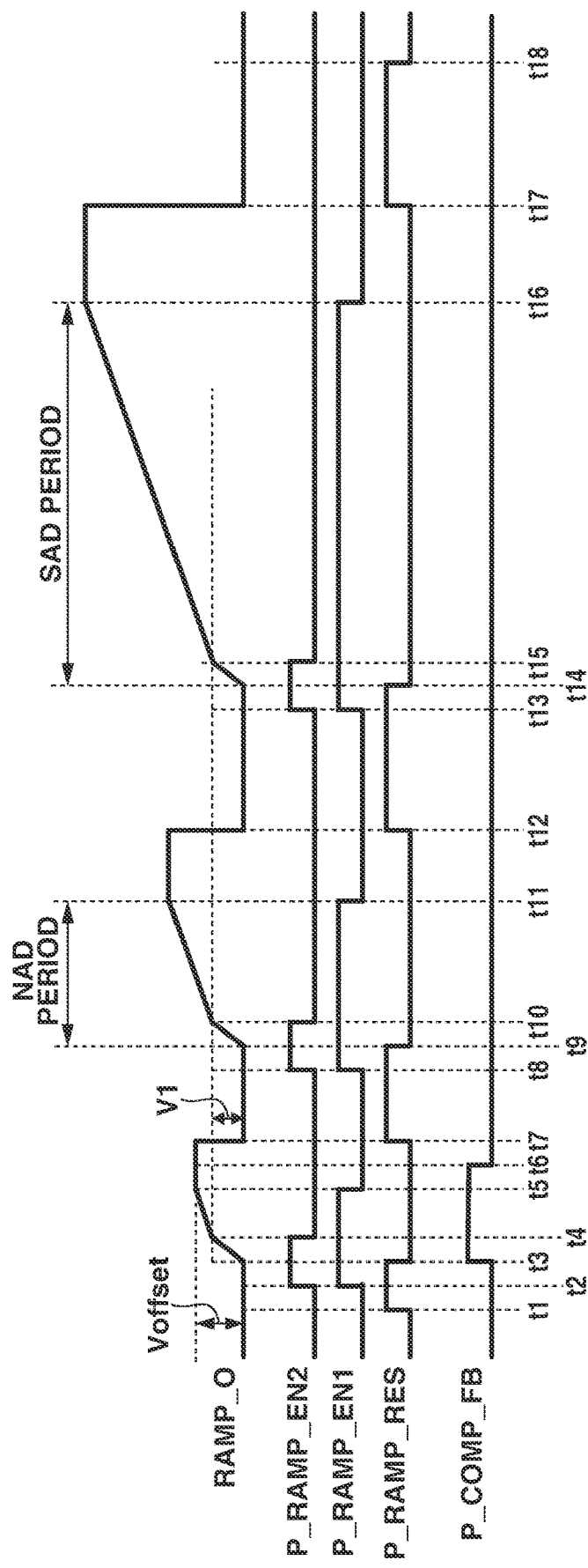
FIG. 4 is a timing diagram illustrating an operation of the AD conversion circuit.

FIG. 4 is a timing diagram illustrating an operation of the ramp signal generation circuit 108 illustrated in FIG. 3.

During the period from time t1 to time t12, the readout circuit 102 outputs a reset level signal from each unit pixel 101 to the comparison circuit 104. During the period from time t12 to time t18, the readout circuit 102 outputs a photoelectric conversion signal from each unit pixel 101.

The reset level signal and the photoelectric conversion signal which are output from each unit pixel 101 will now be described. Typically, each unit pixel 101 includes a photodiode serving as a photoelectric conversion unit, a transfer transistor, a floating diffusion unit, an amplification transistor, a selection transistor, and a reset transistor. A main node of one of the source and the drain of the transfer transistor corresponds to the photoelectric conversion unit, and the main node of the other one of the source and the drain of the transfer transistor is connected to the floating diffusion unit. The floating diffusion unit is connected to the gate of the amplification transistor. The drain of the amplification transistor is supplied with a power supply voltage. The source of the amplification transistor is connected to the main node of one of the source and the drain of the selection transistor. The main node of the other one of the source and the drain of the selection transistor is connected to a signal line provided corresponding to each column of the unit pixels 101. The main node of one of the source and the drain of the reset transistor is supplied with the power supply voltage, and the main node of the other one of the source and the drain of the reset transistor is connected to the floating diffusion unit. The gate of each of the transfer transistor, the reset transistor, and the selection transistor is controlled by the vertical scanning circuit 110.

When the reset transistor is turned on, the floating diffusion unit is reset to a potential based on the power supply voltage. The reset state of the floating diffusion unit is released by turning off the reset transistor. The reset level signal output from each unit pixel 101 is a signal which is output from the amplification transistor and corresponds to the potential of the floating diffusion unit whose reset state is released. The reset level signal is a signal including a noise component of the unit pixel 101.

After that, when the transfer transistor is turned on, signal charges generated such that the photodiode photoelectrically converts incident light are transferred to the floating diffusion unit. Assume herein that the signal charges are electrons. The amplification transistor outputs, as the photoelectric conversion signal, the signal corresponding to the potential of the floating diffusion unit to which the signal charges are transferred. The pixel signal output from each unit pixel 101 includes the reset level signal and the photoelectric conversion signal.

The present exemplary embodiment is described assuming that the readout circuit 102 has a function for inverting and amplifying the pixel signal. Specifically, as the amount of light incident on the photodiode increases, the potential of the photoelectric conversion signal decreases. Since the signal output from the readout circuit 102 is a signal obtained by inverting and amplifying the photoelectric conversion signal, the potential of the signal increases as the amount of light increases. The reset level signal output from each unit pixel 101 is referred to as an N-signal, and the photoelectric conversion signal output from each unit pixel 101 is referred to as an S-signal. A signal obtained by inverting and amplifying the N-signal output from the readout circuit 102 is referred to as an amplified N-signal, and a signal obtained by inverting and amplifying the S-signal output from the readout circuit 102 is referred to as an amplified S-signal.

At time t1, the signal P_RAMP_RES becomes a high level (hereinafter abbreviated as "Hi"). Thus, the switch 305 is turned on. Accordingly, the potential of the reference signal RAMP_O is reset to the ground potential GND.

At time t2, the signals P_RAMP_EN2 and P_RAMP_EN1 become "Hi". Thus, the switches 303 and 304 are turned on. Accordingly, the first current source 301 and the second current source 302 supply a current to the capacitive element 306. However, since the switch 305 is turned on, the capacitive element 306 is not charged and thus the reference signal RAMP_O is maintained at the ground potential GND.

At time t3, the signal P_RAMP_RES becomes a low level (hereinafter abbreviated as "Lo") and the switch 305 is turned off. Accordingly, charging of the capacitive element 306 with the current supplied from each of the first current source 301 and the second current source 302 is started.

Further, the signal P_COMP_FB becomes "Hi". Thus, the switches 204 and 205 of the comparison circuit 104 are turned on and the comparator 201 is reset.

At time t4, the signal P_RAMP_EN2 becomes "Lo". Thus, the switch 304 is turned off. Then, at time t5, the signal P_RAMP_EN1 becomes "Lo", and thus the switch 303 is turned off. Specifically, during the period from time t3 to time t4, the capacitive element 306 is charged with the current supplied from both the first current source 301 and the second current source 302. Further, during the period from time t4 to time t5, the capacitive element 306 is charged with the current supplied from the first current source 301.

Assuming herein that the slope of the reference signal RAMP_O when the capacitive element 306 is charged by both the first current source 301 and the second current source 302 is represented by d12 and the slope of the reference signal RAMP_O when the capacitive element 306 is charged by the first current source 301 is represented by d1, the following Expression (1) is established.

$$d12 > d1 \tag{1}$$

During the period from time t3 to time t4, the capacitive element 306 is rapidly charged, and during the period from time t4 to time t5, the capacitive element 306 is slowly charged. Thus, during the period from time t3 to time t4, the potential of the reference signal RAMP_O changes at a first change rate with a lapse of time. It can be said that the reference signal RAMP_O changes at a second change rate, which is smaller than the first change rate, with a lapse of time during the period from time t4 to time t5. In the present exemplary embodiment, the potential (ground potential GND) of the reference signal RAMP_O during the period from time t1 to time t3 corresponds to an initial potential (first potential).

At time t6, the signal P_COMP_FB becomes "Lo". The reference signal RAMP_O (Voffset) and the output from the readout circuit 102 at time t6 are clamped to the capacitive element 203 and the capacitive element 202, respectively. Thus, resetting of the comparator 201 is completed. The potential Voffset of the reference signal RAMP_O that is used for resetting the comparator 201 corresponds to a third potential.

After that, the reference signal RAMP_O is reset to the ground potential GND corresponding to the first potential.

The signal output from the readout circuit 102 moves forward based on the input of the S-signal. Accordingly, the signal level of the comparison result signal output from the comparator 201 does not change unless the amplitude of the reference signal RAMP_O is more than or equal to the potential Voffset. Therefore, when the resetting of the comparator 201 is completed, the reference signal RAMP_O (Voffset) clamped to the capacitive element 203 adds an offset until changing the comparison result signal to the ground potential GND corresponding to the first potential. Accordingly, the offset added to the comparator 201 is referred to as a comparator offset. The period from time t3 to time t6 in which the comparator offset is added is referred to as an offset addition period. The change of the potential of the reference signal RAMP_O with a lapse of time may have low linearity at the start of the change. The accuracy of AD conversion using a region in which the linearity of the reference signal RAMP_O is low deteriorates. Accordingly, an advantageous effect of using a region in which the linearity of the reference signal RAMP_O is excellent can be obtained by adding an offset.

Further, the potential of the reference signal RAMP_O can be caused to rapidly reach the third potential by increasing a change rate of the reference signal RAMP_O during the period from time t3 to time t4. Thus, an offset can be rapidly added to the comparator 201.

At time t7, the signal P_RAMP_RES becomes "Hi". Accordingly, the switch 305 is turned on and the charge of the capacitive element 306 is discharged to the ground electrode GND. As a result, the reference signal RAMP_O is reset to the ground potential GND (first potential).

At time t8, each of the signals P_RAMP_EN2 and P_RAMP_EN1 becomes "Hi". Thus, the first current source 301 and the second current source 302 supply a current to the capacitive element 306. However, since the switch 305 is turned on, the capacitive element 306 is not charged and thus the reference signal RAMP_O is maintained at the ground potential GND.

At time t9, the signal P_RAMP_RES becomes "Lo" and the switch 305 is turned off. Accordingly, charging of the capacitive element 306 with the current supplied from each of the first current source 301 and the second current source 302 is started. As a result, the potential of the reference signal RAMP_O changes with a lapse of time. That is, the ramp signal is generated.

At time t10, the signal P_RAMP_EN2 becomes "Lo" and the switch 304 is turned off. Then, at time t11, the signal P_RAMP_EN1 becomes "Lo" and the switch 303 is turned off. Specifically, the capacitive element 306 is charged with the current supplied from both the first current source 301 and the second current source 302 during the period from time t9 to time t10. Further, during the period from time t10 to time t11, the capacitive element 306 is charged with the current supplied from the first current source 301.

In other words, during the period from time t9 to time t10, the reference signal RAMP_O changes at the first change rate d12. Then, during the period from time t10 to time t11, the reference signal RAMP_O changes at the second change rate d1.

During the period from time t9 to time t11, the readout circuit 102 outputs the amplified N-signal. The period from time t9 to time t11 in which an AD conversion is performed on the amplified N-signal is referred to as an NAD period.

The reference signal RAMP_O at time t10 is represented by V1, and $$V1 < V\text{offset} \quad (2)$$

Accordingly, the AD conversion gain in the NAD period is determined by the slope d1.

During the period from time t12 to time t14, the signal P_RAMP_RES becomes "Hi", and the reference signal RAMP_O is reset to the ground potential GND (first potential) again.

At time t13, each of the signals P_RAMP_EN2 and P_RAMP_EN1 becomes "Hi". Accordingly, the first current source 301 and the second current source 302 supply a current to the capacitive element 306. However, since the switch 305 is turned on, the capacitive element 306 is not charged and thus the reference signal RAMP_O is maintained at the ground potential GND.

At time t14, the signal P_RAMP_RES becomes "Lo" and the switch 305 is turned off. Accordingly, charging of the capacitive element 306 with the current supplied from each of the first current source 301 and the second current source 302 is started. That is, the ramp signal is generated.

At time t15, the signal P_RAMP_EN2 becomes "Lo" and the switch 304 is turned off. Then, at time t16, the signal P_RAMP_EN1 becomes "Lo". Thus, the switch 303 is turned off. Specifically, during the period from time t14 to time t15, the capacitive element 306 is charged with the current supplied from both the first current source 301 and the second current source 302. Then, during the period from time t15 to time t16, the capacitive element 306 is charged with the current supplied from the first current source 301.

In other words, during the period from time t14 to time t15, the reference signal RAMP_O changes at the first change rate d12. Then, during the period from time t15 to time t16, the reference signal RAMP_O changes at the second change rate d1.

The period from time t14 to time t16 is a period in which an AD conversion is performed on the amplified S-signal. This period is referred to as an SAD period.

Like in the NAD period, the reference signal RAMP_O at time t15 is represented by V1 and a condition the same as that in the above-described Expression (2) is set, and thus the AD conversion gain in the SAD period is determined by the slope d1.

During the period from time t17 to time t18, the signal P_RAMP_RES becomes "Hi". As a result, the reference signal RAMP_O is reset to the ground potential GND.

Like in the present exemplary embodiment, when the reference signal RAMP_O is changed from the first potential to the second potential in each of the offset addition period, the NAD period, and the SAD period, the first change rate is used. Further, when the reference signal RAMP_O is changed from the second potential to the third potential (potential at any one of time t5, time t11, and time t16), the second change rate smaller than the first change rate is used. Thus, the offset addition period (period for resetting the comparator 201) and the AD conversion period can be further reduced than in the case of changing the reference signal RAMP_O from the first potential to the third potential at the second change rate.

According to the present exemplary embodiment, also in the offset addition period, the reference signal RAMP_O is changed with two slopes, like in the NAD period and the SAD period. In the offset addition period, for example, the reference signal RAMP_O may be changed with one type of slope, i.e., the slope d12. In at least one of the NAD period and/or the SAD period, the potential of the ramp signal may be changed using both the first change rate and the second change rate. However, like in the present exemplary embodiment, the advantageous effect of reducing horizontal shading as described above can be obtained by changing the potential of the reference signal RAMP_O during the offset addition period in the same manner as both the NAD period and the SAD period.

For example, when the AD conversion gain is low, i.e., when the reference signal RAMP_O is changed with a large slope, there is no need to control the reference signal RAMP_O with a plurality of slopes in the NAD period and the SAD period, unlike in the present exemplary embodiment.

As described above, an increase in the comparator offset period, the NAD period, and the SAD period can be suppressed by changing the AD conversion gain according to the present exemplary embodiment, so that a high-speed AD conversion can be achieved. Consequently, an image with an excellent quality can be acquired without decreasing a frame rate.

In the present exemplary embodiment, the capacitive element 306 is charged with a current to thereby generate the ramp signal, but instead the ramp signal may be generated by causing the capacitive element 306 to discharge a current.

Second Exemplary Embodiment

Differences between the first exemplary embodiment and a second exemplary embodiment will be mainly described.

If offset components and noise components which are included in digital signals obtained during the NAD period and digital signals obtained during the SAD period are varied in each row, horizontal-striped noise may occur in an image generated using the digital signals.

The second exemplary embodiment illustrates a configuration in which the timing of starting charging of the capacitive element 306, the timing of changing the slope of the reference signal RAMP_O, and a counter operation start timing are synchronized. This configuration makes it possible to prevent the above-described horizontal-striped noise from occurring in an image.

Figure 5:
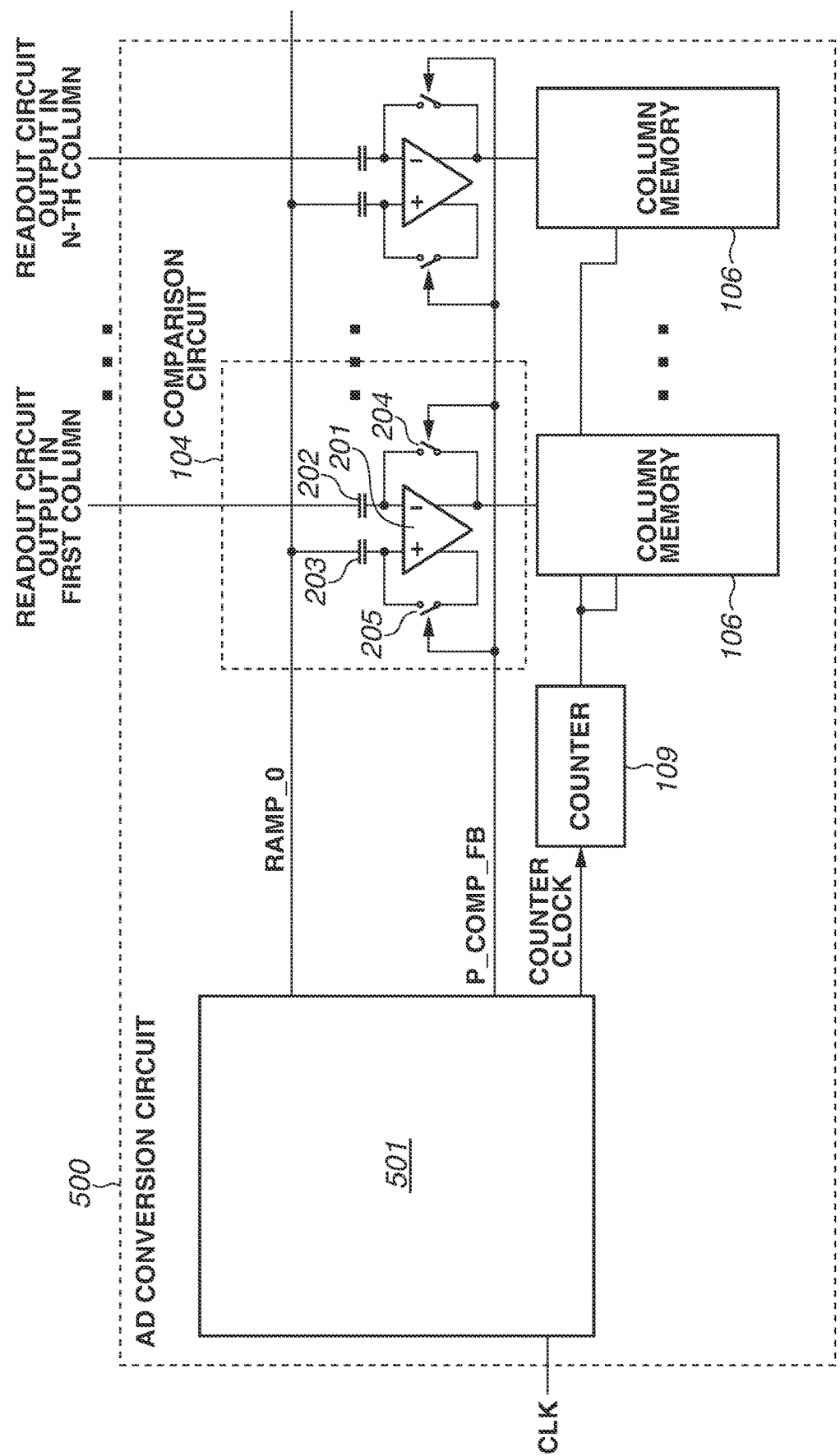
FIG. 5 is a block diagram illustrating a configuration of an AD conversion circuit.

FIG. 5 is a block diagram illustrating a configuration of an AD conversion circuit 500 according to the second exemplary embodiment.

The AD conversion circuit 500 includes a control circuit 501 that controls the comparison circuit 104 in each column and the counter 109. The control circuit 501 includes the TG 111 illustrated in FIG. 1 as described below.

Figure 6:
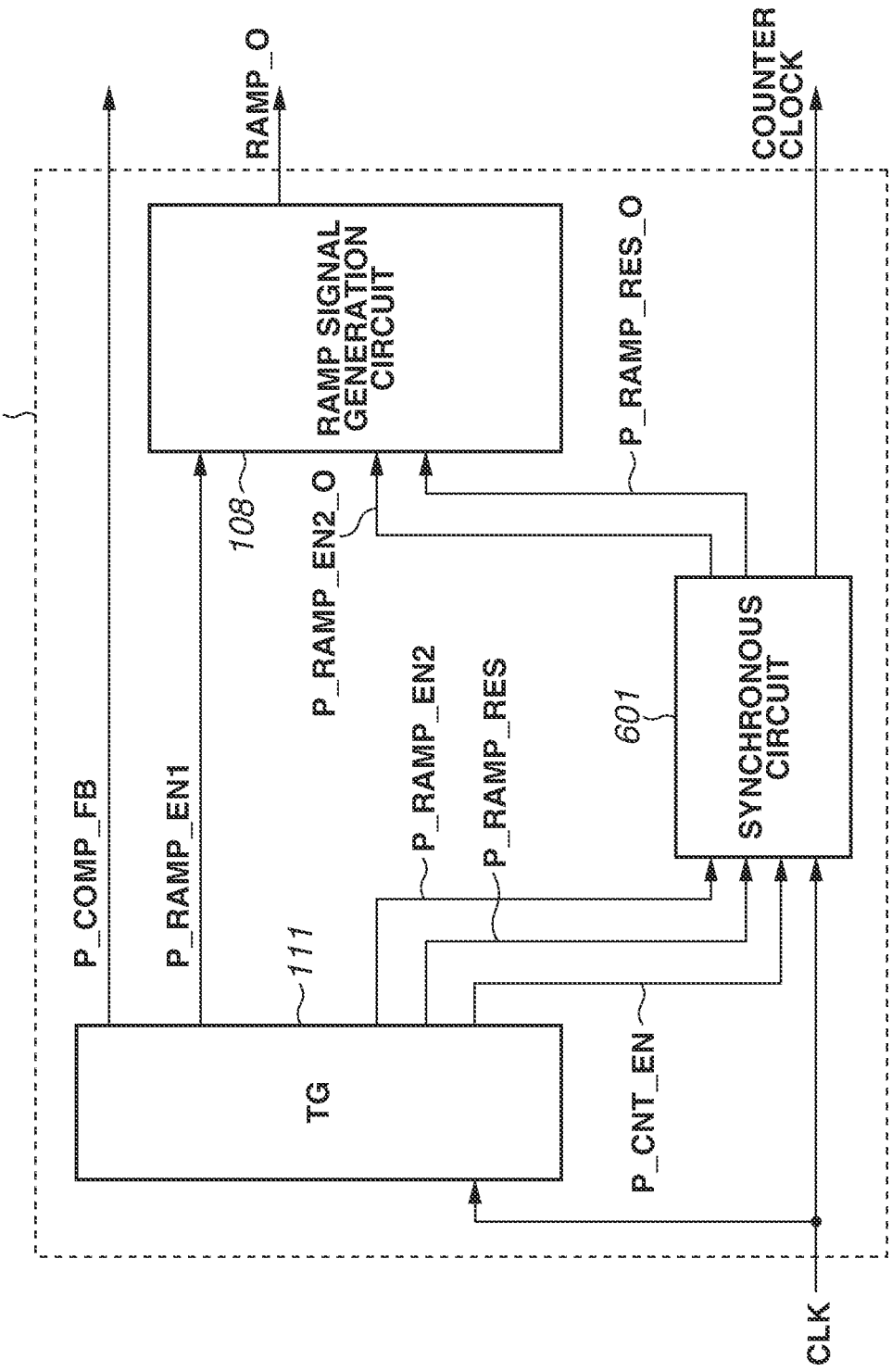
FIG. 6 is a circuit diagram illustrating a configuration of a control circuit that controls the AD conversion circuit.

FIG. 6 is a circuit diagram illustrating the configuration of the control circuit 501.

The signal CLK, which is the reference clock signal, is input to each of the TG 111 and a synchronous circuit 601. The TG 111 outputs the signals P_RAMP_EN2, P_RAMP_RES, and P_CNT_EN to the synchronous circuit 601. Further, the TG 111 outputs the signal P_RAMP_EN1 to the ramp signal generation circuit 108. The synchronous circuit 601 outputs signals P_RAMP_EN2_O and P_RAMP_RES_O to the ramp signal generation circuit 108. The synchronous circuit 601 also outputs the counter clock signal to the counter 109.

The synchronous circuit 601 includes a PLL circuit 701 and a ramp control signal circuit 702 that generates a signal for controlling the ramp signal generation circuit 108.

Figure 7:
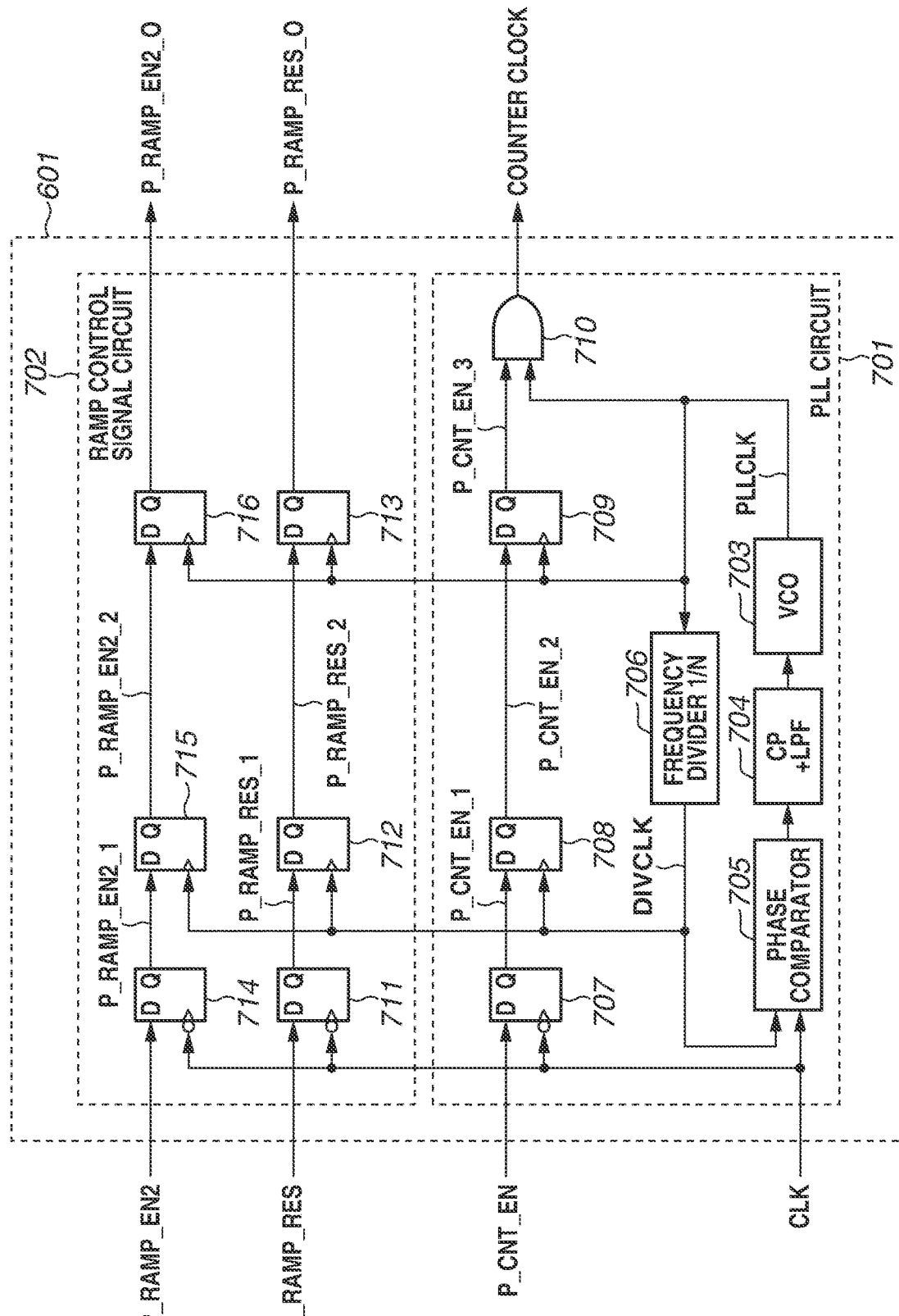
FIG. 7 is a circuit diagram illustrating a configuration of a synchronous circuit.

The configuration of the synchronous circuit 601 will be described in FIG. 7.

The synchronous circuit 601 includes the PLL circuit 701. The signal CLK, which is the reference clock signal, is input to a phase comparator 705 from the outside of the image capturing apparatus. The output from the phase comparator 705 is input to a filter circuit 704 which includes a charge pump and a loop filter. Further, the output from the filter circuit 704 is input to a voltage-controlled-oscillator (VCO) 703. A signal PLLCLK, which is output from the VCO 703, is input to an AND circuit 710.

The signal PLLCLK is input to a frequency divider 706. The frequency divider 706 divides the frequency of the signal PLLCLK by N. Accordingly, a signal DIVCLK output from the frequency divider 706 is represented by the following Expression (3).

$$DIVCLK = PLLCLK/N \quad (3)$$

When the PLL circuit 701 is locked, the following Expression (4) is established.

$$CLK = DIVCLK = PLLCLK/N \quad (4)$$

The signal P_CNT_EN which is a signal for permitting the output of the counter clock signal to the counter 109 will be described. Although the signal P_CNT_EN is not illustrated in FIG. 4, the signal P_CNT_EN is a signal that becomes "Hi" during the period from a time when the potential of the reference signal RAMP_O starts to change to a time when the change ends in each of the NAD period and the SAD period.

A flip-flop (FF) 707 synchronizes a signal change timing of the signal P_CNT_EN with the signal change timing of the signal CLK. An FF 708 synchronizes the signal change timing of A signal P_CNT_EN_L which is output from the FF 707, with the signal change timing of the signal DIVCLK. An FF 709 synchronizes the signal change timing of A signal P_CNT_EN_2, which is output from the FF 708, with the signal change timing of the signal PLLCLK. A signal P_CNT_EN_3, which is output from the PP 709, is input to one of input terminals of the AND circuit 710, and the signal PLLCLK is input to the other one of the input terminals. The signal PLLCLK is supplied as the counter clock signal to the counter 109 during the period in which the signal P_CNT_EN_3 is "Hi".

Next, the ramp control signal circuit 702 will be described.

The signal P_RAMP_EN2 is input to an FF 714. The FF 714 synchronizes the signal change timing of the input signal P_RAMP_EN2 with the signal change timing of the signal CLK, thereby outputting a signal P_RAMP_EN2_1.

An FF 715 synchronizes the signal change timing of the input signal P_RAMP_EN2_1 with the signal change timing of the signal PLLCLK, thereby outputting a signal P_RAMP_EN2_2.

An FF 716 synchronizes the signal change timing of the input signal P_RAMP_EN2_2 with the signal change timing of the signal PLLCLK, thereby outputting the signal P_RAMP_EN2_O. The signal P_RAMP_EN2_O is input to the ramp signal generation circuit 108.

An FF 711 synchronizes the signal change timing of the input signal P_RAMP_RES with the signal change timing of the signal CLK, thereby outputting a signal P_RAMP_RES_1.

An FF 712 outputs a signal P_RAMP_RES_2 obtained by synchronizing the signal change timing of the input signal P_RAMP_RES_1 with the signal DIVCLK.

An FF 713 outputs the signal P_RAMP_RES_O obtained by synchronizing the signal change timing of the signal P_RAMP_RES_2 with the signal PLLCLK. The signal P_RAMP_RES_O is input to the ramp signal generation circuit 108.

A method of generating the above-described control signals will be described with reference to FIG. 8. In the present exemplary embodiment, operations other than the operation illustrated in FIG. 8 are carried out in the same manner as those described in the first exemplary embodiment.

Figure 8:
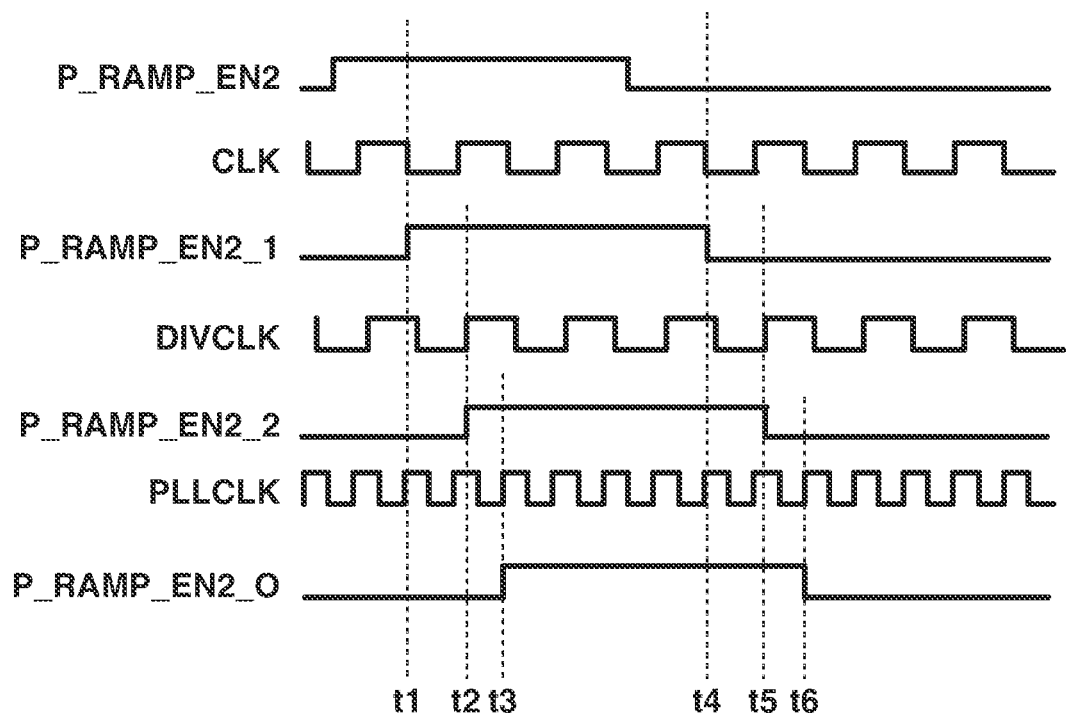
FIG. 8 is a timing diagram illustrating an operation of the synchronous circuit.

FIG. 8 illustrates only how to synchronize the signals P_RAMP_EN2, CLK, DIVCLK, and PLLCLK. The other signals P_RAMP_RES and P_CNT_EN can be generated in the same manner as the method of synchronizing the signal P_RAMP_EN2.

Operations of the FFs 714, 715, and 716 will now be described before explanation of FIG. 8.

The FF 714 imports input data to be input to a D-terminal during the period in which the input to the clock terminal of the FF is "Hi". Then, at a timing when the input from the clock terminal changes to "Lo", an operation for outputting a signal from a Q-terminal is carried out. On the other hand, the FF 715 and the PP 716 import input data to be input to the D-terminal during the period in which the clock terminal is "Lo". Then, at a timing when the input from the clock terminal changes to "Hi", a signal is output from the Q-terminal.

The FF 714 is synchronized with a falling edge of the signal CLK at time t1 and outputs, as the signal P_RAMP_EN2_1, the signal P_RAMP_EN2 obtained when the signal CLK is "Hi" before time t1. In this case, the signal P_RAMP_EN2_1 changes from "Lo" to "Hi".

The FF 714 is synchronized with a falling edge of the signal CLK at time t4 and outputs, as the signal P_RAMP_EN2_1, the signal P_RAMP_EN2 obtained when the signal CLK is "Hi" before time t4. In this case, the signal P_RAMP_EN2_1 changes from "Hi" to "Lo". Thus, the signal P_RAMP_EN2_1 that is synchronized with the signal CLK is generated by the FF 714.

The FF 715 is synchronized with a rising edge of the signal DIVCLK at time t2 and outputs, as the signal P_RAMP_EN2_2, the signal P_RAMP_EN2_1 obtained when the signal DIVCLK is "Lo" before time t2. In this case, the signal P_RAMP_EN2_2 changes from "Lo" to "Hi". The FF 715 is synchronized with a riding edge of the signal DIVCLK at time t5 and outputs, as the signal P_RAMP_EN2_2, the signal P_RAMP_EN2_1 obtained during the period in which the signal DIVCLK is "Lo" before time t5. In this case, the signal P_RAMP_EN2_2 changes from "Hi" to "Lo". Thus, the signal P_RAMP_EN2_2 that is synchronized with the signal DIVCLK is generated by the FF 715.

The FF 716 is synchronized with a rising edge of the signal PLLCLK at time t3 and outputs, as the signal P_RAMP_EN2_O, the signal P_RAMP_EN2_2 obtained when the signal PLLCLK is "Lo" before time t3.

In this case, the signal P_RAMP_EN2_O changes from "Lo" to "Hi". The FF 716 is synchronized with a rising edge of the signal PLLCLK at time t6 and outputs, as the signal P_RAMP_EN2_O, the signal P_RAMP_EN2_2 obtained during the period in which the signal PLLCLK is "Lo" before time t6. In this case, the signal P_RAMP_EN2_O changes from "Hi" to "Lo". Thus, the signal P_RAMP_EN_O that is synchronized with the signal PLLCLK is generated by the FF 716.

In the present exemplary embodiment, a common signal PLL_CLK is input to each of the clock terminals of the FF 709, the FF 713, and the FF 716. Thus, signals P_CNT_EN3, P_RAMP_RES_O, and PRAMP_EN2_O are synchronized by the common signal PLLCLK. The signal P_CNT_EN3 is a signal for permitting the output of the counter clock to the counter 109. The signal P_RAMP_RES_O is a signal for controlling the timing of starting the potential change of the reference signal RAMP_O. The signal PRAMP_EN2_O is a signal for changing the change rate of the potential of the reference signal RAMP_O.

In the present exemplary embodiment, the signals P_CNT_EN3, P_RAMP_RES_O, and PRAMP_EN2_O are synchronized. Thus, the count signal output from the counter 109 is synchronized with each of the timing of starting the potential change of the reference signal RAMP_O and the timing of changing the change rate of the potential of the reference signal RAMP_O. With this configuration, deterioration in the accuracy of AD conversion due to a deviation of the count signal from the timing of starting the potential change of the reference signal RAMP_O, or due to a deviation of the count signal from the timing of changing the change rate of the potential of the reference signal RAMP_O can be prevented. Consequently, horizontal-striped noise that occurs in an image can be reduced.

The present exemplary embodiment illustrates a configuration in which each of the signals P_CNT_EN3, P_RAMP_RES_O, and PRAMP_EN2_O is synchronized three times with the signals CLK, DIVCLK, and PLLCLK. However, the present exemplary embodiment is not limited to this configuration. The signals P_CNT_EN3, P_RAMP_RES_O, and PRAMP_EN2_O may be synchronized with a common signal and may be synchronized at least once.

Third Exemplary Embodiment

Differences between the first exemplary embodiment and a third exemplary embodiment will be mainly described.

Figure 9:
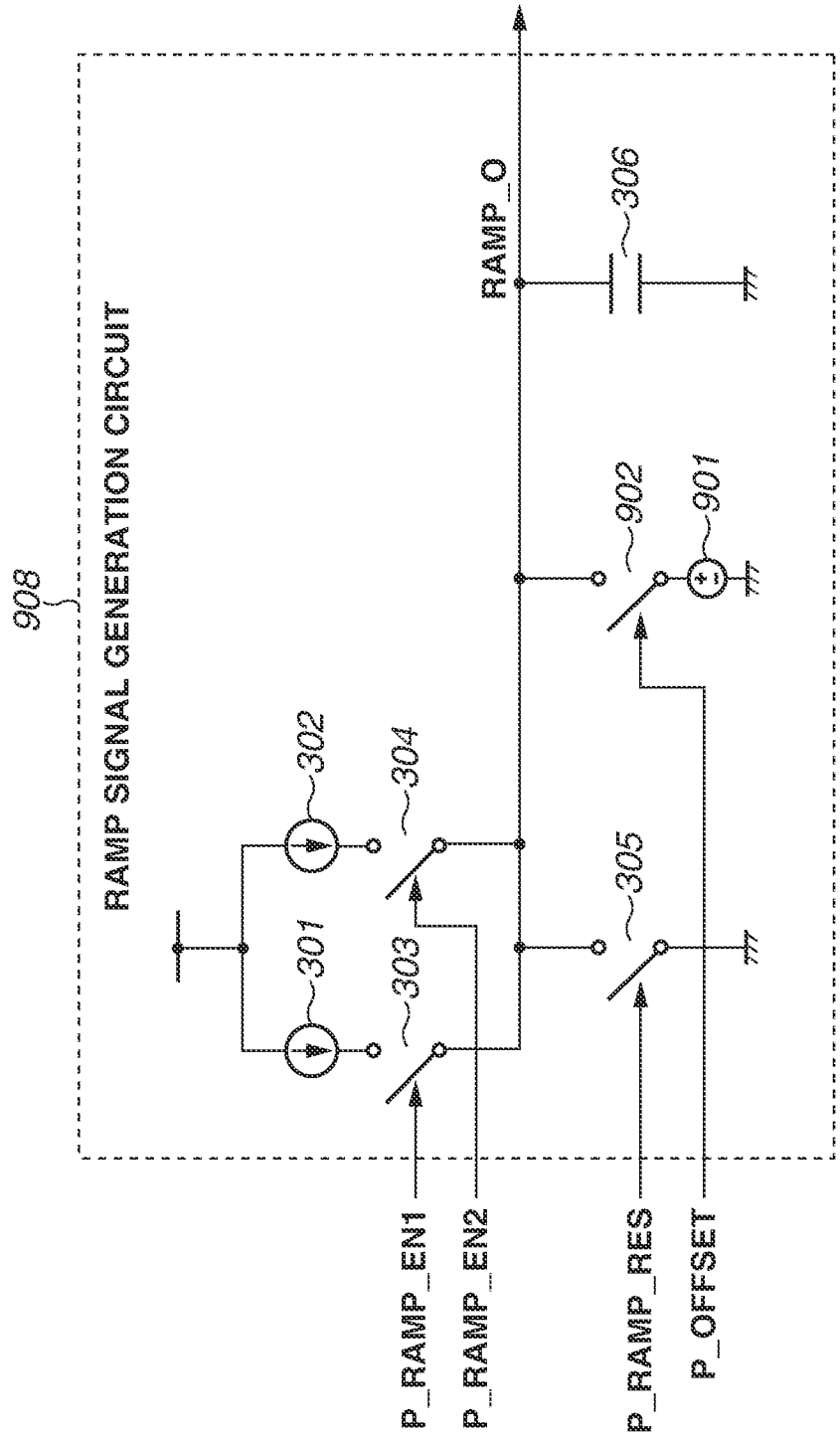
FIG. 9 is a circuit diagram illustrating a configuration of a ramp signal generation circuit.

FIG. 9 is a circuit diagram illustrating a configuration of a ramp signal generation circuit 908 according to the third exemplary embodiment. The configuration of the image capturing apparatus according to the third exemplary embodiment has a configuration in which the ramp signal generation circuit 108 is replaced by the ramp signal generation circuit 908 illustrated in FIG. 9 in the configuration illustrated in FIG. 1.

The ramp signal generation circuit 908 according to the present exemplary embodiment differs from the ramp signal generation circuit 108 according to the first exemplary embodiment in that the ramp signal generation circuit 908 includes a voltage source 901 and a switch 902. Turning on/off of the switch 902 is controlled by a signal P_OFFSET supplied from the TG 111. When the switch 902 is turned on, the potential Voffset is output as the potential of the reference signal RAMP_O from the voltage source 901.

In the ramp signal generation circuit 908 according to the present exemplary embodiment, the voltage source 901 outputs the potential Voffset. According to the first exemplary embodiment, in the operation illustrated in FIG. 4, during the period from time t3 to time t4, the capacitive element 306 is charged with the current from the current source, thereby changing the reference signal RAMP_O to the potential Voffset. In the present exemplary embodiment, the ramp signal generation circuit 908 includes the voltage source 901 that outputs the potential Voffset. With this configuration, the period for changing the reference signal RAMP_O to the potential Voffset can be reduced.

The operation in each of the NAD period and the SAD period can be carried out in the same manner as the first exemplary embodiment.

Fourth Exemplary Embodiment

Differences between the first exemplary embodiment and a fourth exemplary embodiment will be mainly described.

In the first exemplary embodiment, the ramp signal generation circuit 108 generates the ramp signal by charging the capacitive element with the current supplied from the current source. In the fourth exemplary embodiment, a digital analog conversion (DAC) circuit is used as the ramp signal generation circuit.

Figure 10:
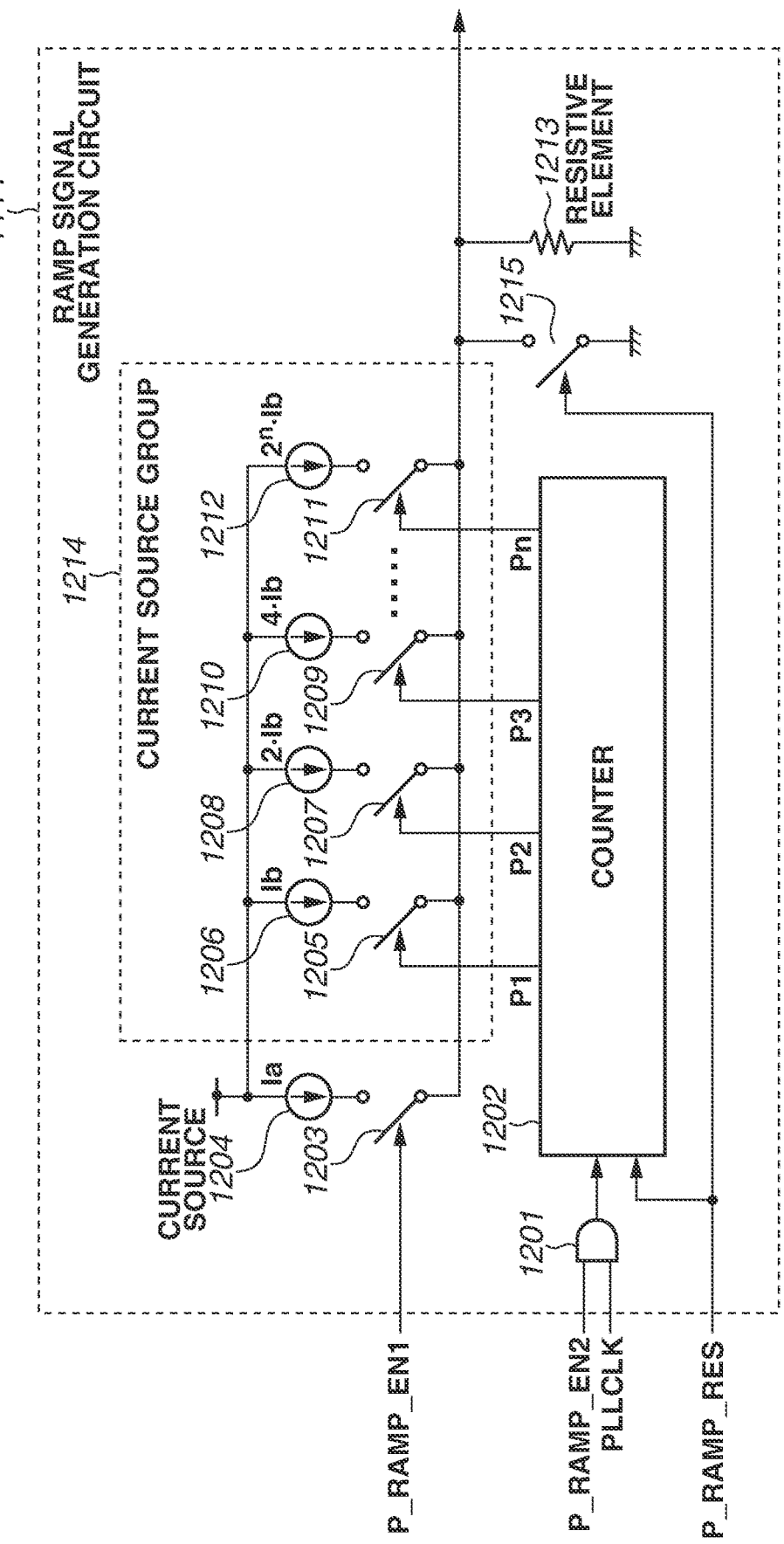
FIG. 10 is a circuit diagram illustrating a configuration of a ramp signal generation circuit.

FIG. 10 is a circuit diagram illustrating a configuration of a ramp signal generation circuit 1111 according to the present exemplary embodiment. The image capturing apparatus according to the present exemplary embodiment has a configuration in which the ramp signal generation circuit 108 illustrated in FIG. 1 is replaced by the ramp signal generation circuit 1111.

The ramp signal generation circuit 1111 according to the present exemplary embodiment includes an AND circuit 1201, a counter 1202, a switch 1203, a current source 1204, a switch 1205, a resistive element 1213, and a current source group 1214.

The current source group 1214 includes current sources 1206, 1208, 1210, and 1212 and switches 1205, 1207, 1209, and 1211. The counter 1202 outputs signals P1 to Pn to the switches 1205, 1207, 1209, and 1211, respectively. While FIG. 10 illustrates a configuration in which the current source group 1214 includes four current sources and four switches. However, in practice, the current source group 1214 includes a larger number of current sources and switches. The number of current sources and the number of switches are each set to a value obtained by adding "1" to the number of bits of the digital signal generated by performing an AD conversion. In the case of performing a 12-bit AD conversion, "n" is 13 and thus 13 current sources and 13 switches are controlled by the counter 1202.

The relationship among the amounts of current supplied from the current sources 1206, 1208, 1210, and 1212 is set to correspond to the n-th power of 2. Specifically, the amounts of current supplied from the current sources 1206, 1208, 1210, and 1212 are represented by Ib, 2·Ib, 4·Ib, and $2^n$·Ib, respectively.

FIG. 12 is a table illustrating relationships among a count value of the counter 1202, control signals, and a value of a current flowing through the resistive element 1213. As illustrated in the table of FIG. 12, the signal P1 repeatedly changes between "Hi" and "Lo" every time the count value output from the counter 1202 is incremented by "1". The signal P2 repeatedly changes between "Hi" and "Lo" every time the count value is incremented by "2". The signal P3 repeatedly changes between "Hi" and "Lo" every time the count value is incremented by "4". The table of FIG. 12 illustrates only the signals P1 to P3. The signals P1 to Pn correspond to lower-order bits to higher-order bits. The current value of each of the current sources corresponding to the signals P1 to Pn corresponds to the n-th power of 2 of the amount of current Ib which is set as a reference.

As illustrated in FIG. 12, the value of the current flowing through the resistive element 1213 is increased by Ib every time the count value of the counter 1202 is incremented by "1".

The AND circuit 1201 outputs the logical AND of the input signals PLLCLK and P_RAMP_E2 to the counter 1202.

The switch 1203 receives the signal P_RAMP_EN1 from the TG 111. Further, a switch 1215 receives the signal P_RAMP_RES from the TG 111.

Figure 11:
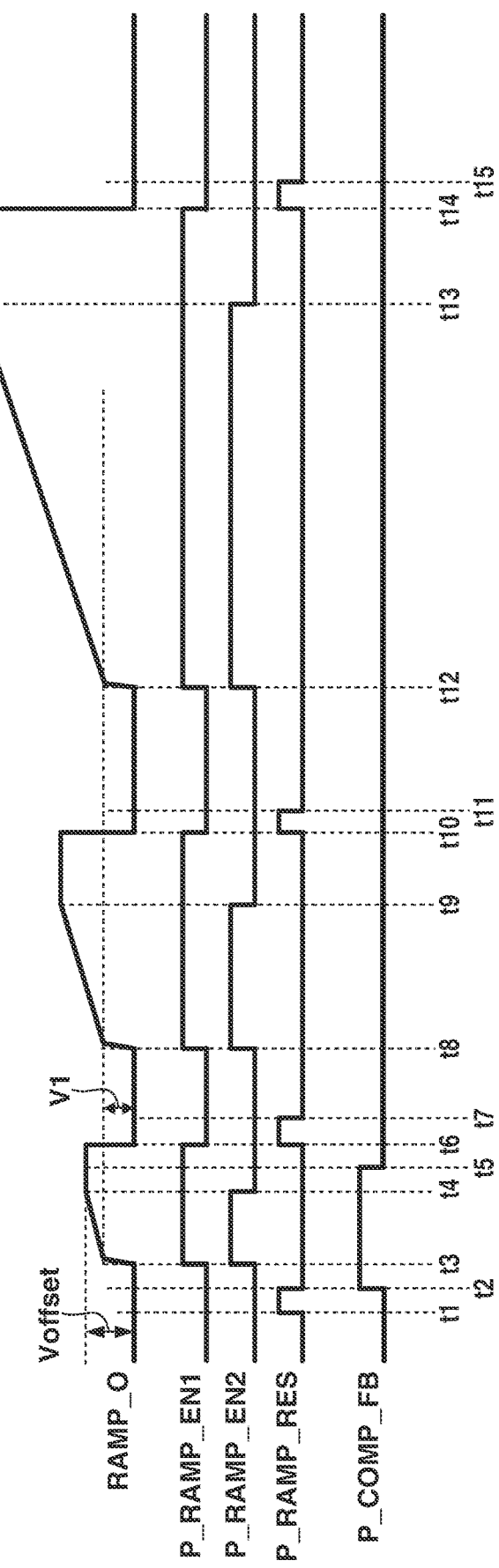
FIG. 11 is a timing diagram illustrating an operation of an AD conversion circuit.

FIG. 11 is a timing diagram illustrating an operation of the image capturing apparatus including the ramp signal generation circuit 1111 illustrated in FIG. 10.

During the period from time t1 to time t2, the signal P_RAMP_RES becomes "Hi". Accordingly, the counter 1202 is reset. Further, the switch 1215 is turned on and the reference signal RAMP_O is reset to the ground potential GND.

During the period from time t2 to time t5, the signal P_COMP_FB becomes "Hi". This period corresponds to the offset addition period described in the first exemplary embodiment.

During the period from time t3 to time t4, the signal P_RAMP_EN2 becomes "Hi". During this period, the signal PLLCLK is supplied to the counter 1202. The counter 1202 supplies the signals P1 to Pn to the switches 1205, 1207, 1209, and 1211, respectively.

During the period from time t3 to time t6, the signal P_RAMP_EN1 becomes "Hi". The switch 1203 is turned on and the current source 1204 supplies a current value Ia to the resistive element 1213.

Assuming that the resistance value of the resistive element 1213 is represented by R1, the reference signal RAMP_O at time t3 is expressed by the following Expression (5).

$$RAMP\_O = R1 \times Ia = V1 \qquad (5)$$

During the period from time t3 to time t4, the following Expression (6) is established based on the count value of the counter 1202.

$$RAMP\_O = R1 \times Ia + R1 \times (Pn \times 2^n + P(n-1) \times 2^{(n-1)} + \ldots \\ + P3 \times 2^2 + P2 \times 2^1 + P1 \times 2^0) \times Ib \qquad (6)$$

The signals Pn to P1 in the Expression (6) indicate "1" when each of the signals Pn to P1 is "Hi", and indicate "0" when each of the signals Pn to P1 is "Lo".

At time t4, the signal P_RAMP_EN2 becomes "Lo". Thus, the supply of the signal PLLCLK to the counter 1202 is stopped and the count operation of the counter 1202 is stopped. Accordingly, the total amount of current from the current source group 1214 is fixed at the current value obtained at the time. The reference signal RAMP_O used in this case corresponds to the potential Voffset.

During the period from time t4 to time t6, the value of the current flowing through the resistive element 1213 does not change, and thus the reference signal RAMP_O is maintained at the potential Voffset. As expressed in Expression (5) and Expression (6), R1×Ia does not contribute to the slope of the reference signal RAMP_O, but instead acts as an offset. Accordingly, if the current Ia is variable, any offset can be added to the reference signal RAMP_O.

During the period from time t6 to time t7, the signal P_RAMP_RES becomes "Hi". Accordingly, the count value of the counter 1202 is reset. Further, the switch 1215 is turned on and thus the reference signal RAMP_O is reset to the ground potential GND.

During the period from time t8 to time t10, the signal P_RAMP_EN1 becomes "Hi". During the period from time t8 to time t9, the signal P_RAMP_EN2 becomes "Hi".

The reference signal RAMP_O obtained at time t8 is the same as that in Expression (5). During the period from time t8 to time t9, the reference signal RAMP_O gradually increases in accordance with Expression (6) based on the count value of the counter 1202.

In the present exemplary embodiment, the period from time t8 to time t9 corresponds to the NAD period described in the first exemplary embodiment.

At time t9, the signal P_RAMP_EN2 becomes "Lo". Thus, the count operation of the counter 1202 is stopped. The total amount of current from the current source group 1214 is fixed at the current value obtained at the time. During the period from time t9 to time t10, the value of the current flowing through the resistive element 1213 does not change, and thus the reference signal RAMP_O obtained at time t9 is maintained until time t10.

During the period from time t10 to time t11, the signal P_RAMP_RES becomes "Hi". Thus, the count value of the counter 1202 is reset. Further, the switch 1215 is turned on and the reference signal RAMP_O is reset to the ground potential GND.

During the period from time t12 to time t14, the signal P_RAMP_EN1 becomes "Hi". During the period from time t12 to time t13, the signal P_RAMP_EN2 becomes "Hi".

The reference signal RAMP_O obtained at time t12 is the same as that in Expression (5). During the period from time t12 to time t13, the reference signal RAMP_O gradually increases in accordance with Expression (6) based on the count value of the counter 1202.

In the present exemplary embodiment, the period from time t12 to time t13 corresponds to the SAD period described in the first exemplary embodiment.

At time t13, the signal P_RAMP_EN2 becomes "Lo". Thus, the count operation of the counter 1202 is stopped. Accordingly, the total amount of current from the current source group 1214 is fixed at the current value obtained at the time. During the period from time t13 to time t14, the value of the current flowing through the resistive element 1213 does not change, and thus the reference signal RAMP_O obtained at time t13 is maintained until time t14.

During the period from time t14 to time t15, the signal P_RAMP_RES becomes "Hi", and the counter 1202 is reset. Further, the switch 1215 is turned on and the reference signal RAMP_O is reset to the ground potential GND.

As described above, any offset is added to the reference signal RAMP_O in each of the offset addition period, the NAD period, and the SAD period. Thus, a desired offset can be added in a short period of time.

Accordingly, even when the slope of the reference signal RAMP_O in each of the NAD period and the SAD period is made gentle to increase the AD conversion gain, an AD conversion can be started from a state where a desired offset is added to the reference signal RAMP_O, while suppressing an increase in the AD conversion period. Therefore, a decrease in the frame rate can be prevented also when the AD conversion gain is high.

Also, in the present exemplary embodiment, the signals P_RAMP_EN2 and P_CNT_EN may be synchronized using the same signal by the same method as the second exemplary embodiment.

The current value Ia obtained in the offset addition period, the current value Ia obtained in the NAD period, and the current value Ia obtained in the SAD period may be respective different values.

For example, assuming that the current value Ia obtained in the offset addition period is represented by Iao and the current value Ia obtained in the other periods (at least one of the NAD period and/or the SAD period) is represented by Iaad, the following Expression (7) is established.

$$Iao > Iaad \quad (7)$$

Thus, even when the signal P_RAMP_EN2 is fixed to "Lo" during the period from time t3 to time t4 illustrated in FIG. 11, the following Expression (8) is established.

$$Voffset > V1 \text{ at time } t8 \quad (8)$$

Accordingly, there is no need to set the signal P_RAMP_EN2 in the offset addition period to "Hi" and to add an offset using the current source group 1214. Therefore, the offset addition period can be shortened and a decrease in the frame rate can be prevented.

Fifth Exemplary Embodiment

Figure 13:
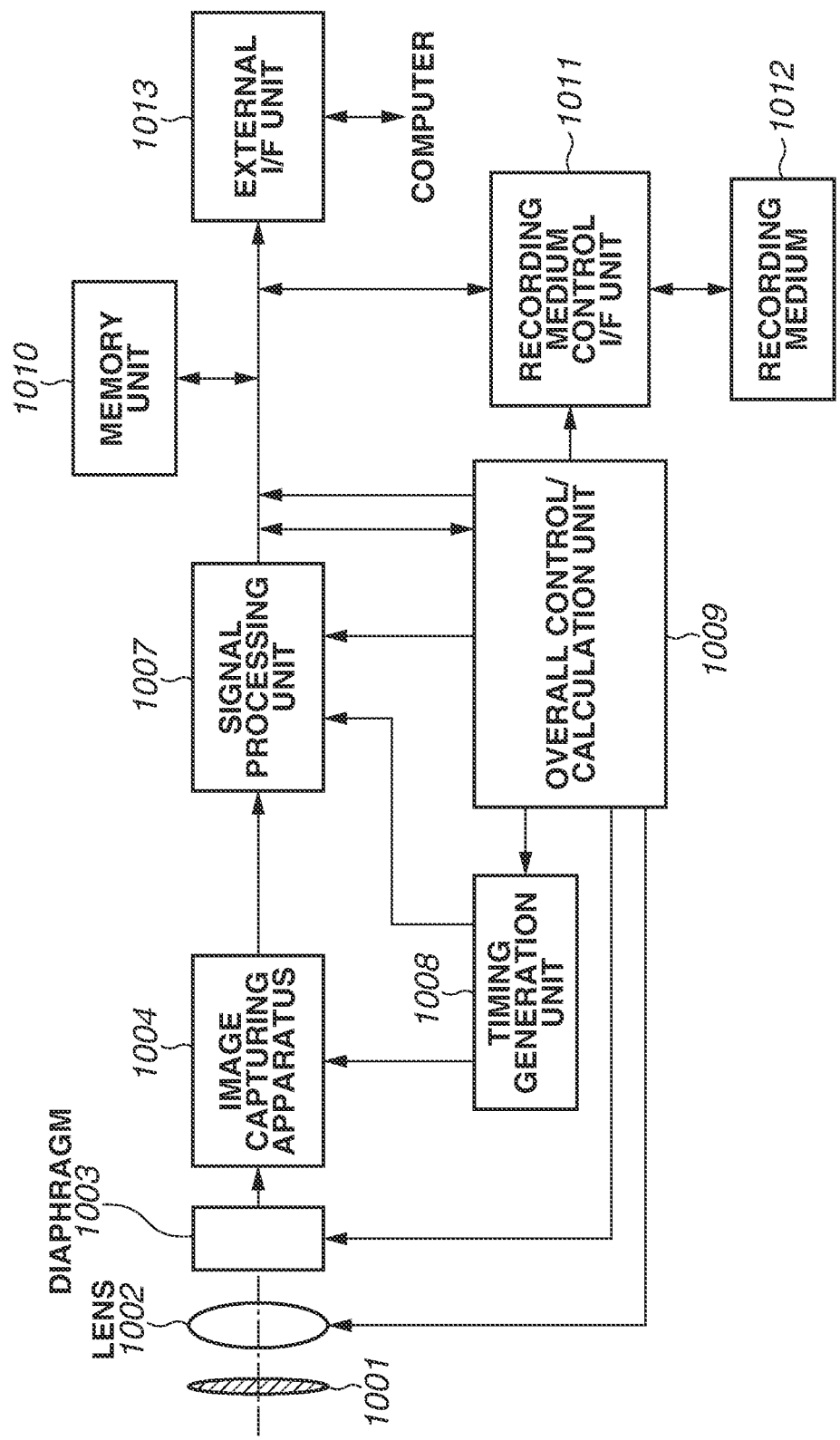
FIG. 13 is a block diagram illustrating a configuration of a photoelectric conversion system.

A photoelectric conversion system according to a fifth exemplary embodiment will be described with reference to FIG. 13. FIG. 13 is a block diagram illustrating a schematic configuration of the photoelectric conversion system according to the fifth present exemplary embodiment.

The image capturing apparatuses described in the first to fourth exemplary embodiments can be applied to various photoelectric conversion systems. Examples of applicable photoelectric conversion systems include a digital still camera, a digital camcorder, a monitoring camera, a copying machine, a facsimile machine, a mobile phone, an on-vehicle camera, and a satellite. Examples of the photoelectric conversion systems also include a camera module including an optical system, such as a lens, and an image capturing apparatus. FIG. 13 is a block diagram illustrating a digital camera as an example of the photoelectric conversion system.

The photoelectric conversion system illustrated in FIG. 13 includes an image capturing apparatus 1004, a lens 1002 that focuses an optical image of an object on the image capturing apparatus 1004, a diaphragm 1003 for varying the amount of light passing through the lens 1002, and a barrier 1001 for protecting the lens 1002. The lens 1002 and the diaphragm 1003 are optical systems that condense light on the image capturing apparatus 1004. The image capturing apparatus 1004 corresponds to the photoelectric conversion apparatus (image capturing apparatus) according to any one of the exemplary embodiments described above, and converts an optical image formed by the lens 1002 into an electric signal.

The photoelectric conversion system further includes a signal processing unit 1007 as an image generation unit that generates an image by performing processing on an output signal output from the image capturing apparatus 1004. The signal processing unit 1007 performs an operation for performing various correction and compression processes, as needed, and outputting image data. The signal processing unit 1007 may be formed on a semiconductor substrate on which the image capturing apparatus 1004 is provided, or may be formed on another semiconductor substrate different from the semiconductor substrate on which the image capturing apparatus 1004 is provided. The image capturing apparatus 1004 and the signal processing unit 1007 may be formed on the same semiconductor substrate.

The photoelectric conversion system further includes a memory unit 1010 for temporarily storing image data, and an external interface unit (external I/F unit) 1013 for communicating with an external computer or the like. The photoelectric conversion system further includes a recording medium 1012, such as a semiconductor memory, for recording or reading captured image data, and a recording medium control interface unit (recording medium control I/F unit) 1011 for recording or reading out data on or from the recording medium 1012. The recording medium 1012 may be incorporated in the photoelectric conversion system, or may be detachably mounted on the photoelectric conversion system.

The photoelectric conversion system includes an overall control/calculation unit 1009 that controls various calculations and controls the overall operation of the digital still camera, and a timing generation unit 1008 that outputs various timing signals to each of the image capturing apparatus 1004 and the signal processing unit 1007. In this case, the timing signals and the like may be externally input and the photoelectric conversion system may include at least the image capturing apparatus 1004 and the signal processing unit 1007 that processes an output signal output from the image capturing apparatus 1004.

The image capturing apparatus 1004 outputs an image capturing signal to the signal processing unit 1007. The signal processing unit 1007 executes predetermined signal processing on the image capturing signal output from the image capturing apparatus 1004, and outputs image data. The signal processing unit 1007 generates an image using the image capturing signal.

As described above, according to the present exemplary embodiment, the photoelectric conversion system to which the photoelectric conversion apparatus (image capturing apparatus) according to any one of the exemplary embodiments described above is applied can be achieved.

Sixth Exemplary Embodiment

Figure 14A:
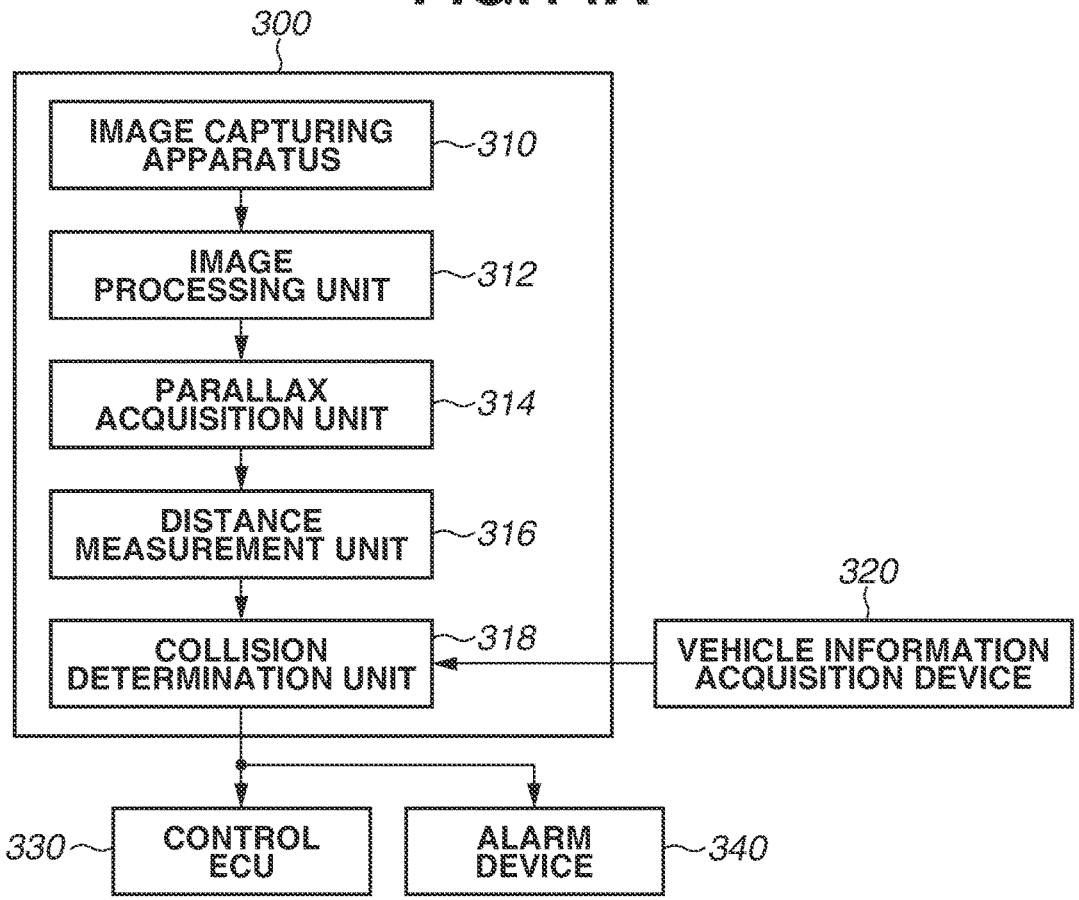
FIGS. 14A and 14B illustrate a configuration and operation of a photoelectric conversion system and a moving body.
Figure 14B:
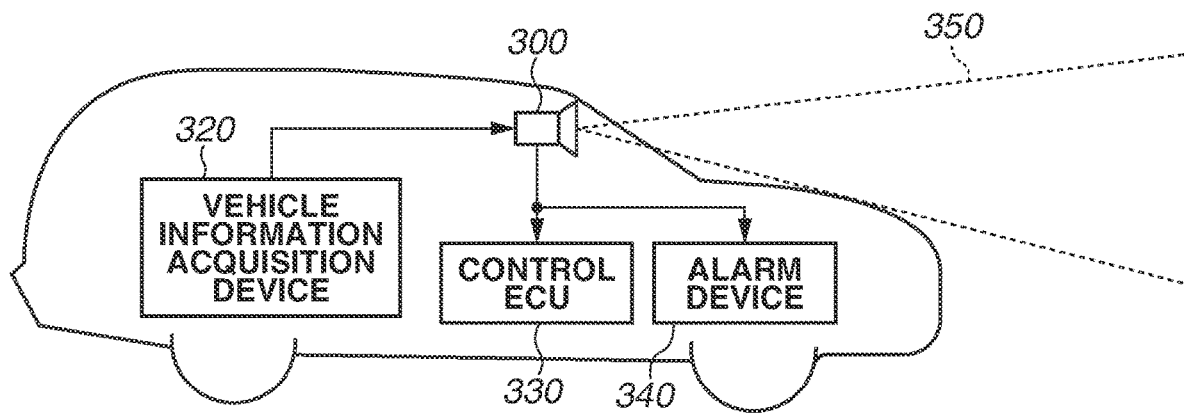

A photoelectric conversion system and a moving body according to a sixth exemplary embodiment will be described with reference to FIGS. 14A and 14B. FIGS. 14A and 14B illustrate configurations of the photoelectric conversion system and the moving body according to the present exemplary embodiment.

FIG. 14A illustrates an example of the photoelectric conversion system for an on-vehicle camera. A photoelectric conversion system 300 includes an image capturing apparatus 310. The image capturing apparatus 310 is used as the photoelectric conversion apparatus (image capturing apparatus) according to any one of the exemplary embodiments described above. The photoelectric conversion system 300 further includes an image processing unit 312 that performs image processing on a plurality of pieces of image data acquired by the image capturing apparatus 310, and a parallax acquisition unit 314 that calculates a parallax (a phase difference between parallax images) based on the plurality of pieces of image data acquired by the photoelectric conversion system 300. The photoelectric conversion system 300 further includes a distance measurement unit 316 that calculates a distance to a target object based on the calculated parallax, and a collision determination unit 318 that determines whether there is a possibility that a collision may occur based on the calculated distance. In this case, the parallax acquisition unit 314 and the distance measurement unit 316 are examples of a distance information acquisition unit that acquires distance information about a distance to a target object. The term "distance information" refers to information about, for example, a parallax, a defocus amount, and a distance to a target object. The collision determination unit 318 may determine the possibility of occurrence of a collision by using any one piece of the distance information. The distance information acquisition unit may be implemented by hardware designed for exclusive use, or may be implemented by a software module. Further, the distance information acquisition unit may be implemented by a field programmable gate array (FPGA), an application specific integrated circuit (ASIC), or the like, or a combination thereof.

The photoelectric conversion system 300 is connected to a vehicle information acquisition device 320, and can acquire vehicle information such as a vehicle speed, a yaw rate, and a rudder angle. The photoelectric conversion system 300 is also connected to a control electronic control unit (ECU) 330 which is a control device that outputs a control signal for generating a braking force for a vehicle based on the determination result from the collision determination unit 318. The photoelectric conversion system 300 is also connected to an alarm device 340 which issues an alarm to a driver based on the determination result from the collision determination unit 318. For example, if it is highly likely that a collision may occur based on the result of determination by the collision determination unit 318, the control ECU 330 performs vehicle control for avoiding a collision or reducing a damage by, for example, applying a brake, releasing an accelerator, or suppressing an engine output. The alarm device 340 issues an alarm to a user by, for example, issuing an alarm such as sound, displaying alarm information on a screen of a car navigation system or the like, or applying a vibration to a seat belt or a steering wheel.

In the present exemplary embodiment, the photoelectric conversion system 300 captures an image of the periphery of the vehicle, for example, the front or the back of the vehicle. FIG. 14B illustrates the photoelectric conversion system 300 when an image of the front of the vehicle (image capturing range 350) is captured. The vehicle information acquisition device 320 sends an instruction to the photoelectric conversion system 300 or the image capturing apparatus 310. With this configuration, the accuracy of ranging can be further improved.

While the present exemplary embodiment described above illustrates an example of a control operation for preventing the vehicle from colliding with another vehicle, the present exemplary embodiment can also be applied to, for example, a control operation for automatic driving by following another vehicle, and a control operation for automatic driving to prevent the vehicle from deviating from a lane. Further, the photoelectric conversion system is not limited to a vehicle, such as a vehicle in which the photoelectric conversion system 300 is mounted, but instead can be applied to, for example, a moving body (moving apparatus), such as a ship, an aircraft, or an industrial robot. In addition, the present exemplary embodiment is not limited to a moving body, but instead can be applied to devices that widely use object recognition, such as an intelligent transportation system (ITS).

Modified Exemplary Embodiments

The disclosure is not limited to the exemplary embodiments described above and can be modified in various ways.

For example, an example where some of the configurations according to any one of the exemplary embodiments described above are added to other exemplary embodiments, and an example where some of the configurations according to any one of the exemplary embodiments described above are replaced by some of the configurations according to other exemplary embodiments are also included in the exemplary embodiments of the disclosure.

The photoelectric conversion systems described above in the fifth and sixth exemplary embodiments are examples of the photoelectric conversion system to which the photoelectric conversion apparatus according to the disclosure can be applied, and the photoelectric conversion system to which the photoelectric conversion apparatus according to the disclosure can be applied is not limited to the configurations illustrated in FIG. 13 and FIGS. 14A and 14B.

The exemplary embodiments described above merely illustrate specific examples for carrying out the disclosure, and the technical scope of the disclosure should not be limitatively interpreted by the exemplary embodiments. That is, the aspect of the embodiments can be carried out in various forms without departing from the technical idea of the aspect of the embodiments or the principal features of the aspect of the embodiments.

According to the present disclosure, it is possible to further reduce the AD conversion period or the period for resetting the comparator.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-155626, filed Aug. 28, 2019 which is hereby incorporated by reference herein in its entirety.

What is claimed is:

1. An analog-to-digital (AD) conversion circuit, comprising a comparator configured to compare an analog signal with a ramp signal and output a comparison result signal indicating a result of the comparison, and performing an AD conversion using the comparison result signal to convert the analog signal into a digital signal,
wherein in the comparison, a potential of the ramp signal changes with a lapse of time from a first potential to a second potential, and
wherein before the comparison, the potential of the ramp signal changes at a first change rate and then changes at a second change rate smaller than the first change rate, the potential of the ramp signal changes from the first potential to a third potential between the first potential and the second potential, and the comparator is reset in a state where the third potential is input to the comparator.

2. The AD conversion circuit according to claim 1, wherein in the comparison, the potential of the ramp signal changes at the first change rate from the first potential to a fourth potential between the first potential and the third potential, and changes from the fourth potential at the second change rate.

3. The AD conversion circuit according to claim 2, wherein a length of a period from a time when the potential of the ramp signal start to change from the first potential to a time when a change rate of the potential of the ramp signal changes from the first change rate to the second change rate in the comparison is equal to that length of the period in the resetting of the comparator.

4. The AD conversion circuit according to claim 1, wherein a length of a period from a time when the potential of the ramp signal starts to change from the first potential to a time when a change rate of the potential of the ramp signal changes from the first change rate to the second change rate in the comparison is equal to that length of the period in the resetting of the comparator.

5. The AD conversion circuit according to claim 1, wherein the potential of the ramp signal that changes from the first potential to the second potential in the comparison is equal to that potential of the ramp signal in the resetting of the comparator.

6. The AD conversion circuit according to claim 1, wherein the AD conversion circuit performs a plurality of the AD conversions, and
wherein in the comparison for each of the plurality of AD conversions, during the change of the potential of the ramp signal from the first potential to the third potential, the potential of the ramp signal changes at the first change rate and then changes at the second change rate.

7. The AD conversion circuit according to claim 6, wherein the plurality of AD conversions convert the analog signals having different values into respective digital signals.

8. The AD conversion circuit according to claim 7, wherein a period from a time when the potential of the ramp signal starts to change from the first potential to a time when a change rate of the potential of the ramp signal changes from the first change rate to the second change rate is a same length in the plurality of AD conversions.

9. The AD conversion circuit according to claim 6, wherein a period from a time when the potential of the ramp signal starts to change from the first potential to a time when a change rate of the potential of the ramp signal changes from the first change rate to the second change rate is a same length in the plurality of AD conversions.

10. The AD conversion circuit according to claim 6, wherein the potential of the ramp signal that changes from the first potential to the second potential is a same potential in the plurality of AD conversions.

11. The AD conversion circuit according to claim 1, further comprising:
a ramp signal generation circuit configured to generate the ramp signal;
a counter configured to count pulse signals to generate a count signal; and
a synchronous circuit,
wherein the synchronous circuit outputs a control signal to the ramp signal generation circuit and outputs the pulse signals to the counter.

12. The AD conversion circuit according to claim 11, wherein the control signal is a signal for changing a change rate of the potential of the ramp signal from the first change rate to the second change rate.

13. The AD conversion circuit according to claim 11,
wherein the synchronous circuit includes a first flip-flop circuit configured to generate the control signal and including a first clock terminal, and a second flip-flop circuit configured to generate the pulse signals and including a second clock terminal, and
wherein a common signal is input to each of the first clock terminal and the second clock terminal.

14. The AD conversion circuit according to claim 1,
wherein the potential of the ramp signal is changed by causing a capacitive element to charge with a current or discharge, and
wherein the first change rate and the second change rate are changed by changing a value of the current.

15. The AD conversion circuit according to claim 1, further comprising:
a first capacitive element; and
a second capacitive element,
wherein the comparator includes a first input terminal and a second input terminal,
wherein the analog signal is input to the first input terminal through the first capacitive element,
wherein the ramp signal is input to the second input terminal through the second capacitive element, and
wherein the resetting of the comparator is an operation for resetting charges of the first capacitive element and the second capacitive element.

16. A photoelectric conversion apparatus comprising:
the AD conversion circuit according to claim 1; and
an analog signal output unit configured to generate a charge based on incident light and output a signal based on the charge as the analog signal.

17. A photoelectric conversion system comprising:
the photoelectric conversion apparatus according to claim 16; and
an image generation unit configured to generate an image using the digital signal output from the photoelectric conversion apparatus.

18. A moving body comprising:
the photoelectric conversion apparatus according to claim 16; and
a distance information acquisition unit configured to acquire distance information about a distance to a target object from a parallax image based on a signal output from the photoelectric conversion apparatus,
wherein the moving body further comprises a control unit configured to control the moving body based on the distance information.

19. An analog-to-digital (AD) conversion circuit, comprising a comparator configured to compare an analog signal with a ramp signal and output a comparison result signal indicating a result of the comparison, and performing an AD conversion using the comparison result signal to convert the analog signal into a digital signal,
wherein in the comparison, a potential of the ramp signal changes with a lapse of time from a first potential to a second potential,
wherein before the comparison, the comparator is reset in a state where a third potential is input to the comparator, the third potential being a voltage between the first potential and the second potential, and
wherein in the comparison, during the change of the potential of the ramp signal from the first potential to the third potential, the potential of the ramp signal changes at a first change rate and then changes at a second change rate smaller than the first change rate.

20. The AD conversion circuit according to claim 19, wherein in the comparison, the ramp signal changes from the third potential to the second potential at the second change rate.

21. The AD conversion circuit according to claim 19, wherein in the resetting of the comparator, the potential of the ramp signal changes from the first potential at the first change rate and then changes to the second potential at the second change rate.

22. The AD conversion circuit according to claim 21, wherein a length of a period from a time when the potential of the ramp signal starts to change from the first potential to a time when a change rate of the potential of the ramp signal changes from the first change rate to the second change rate in the comparison is equal to that length of the period in the resetting of the comparator.

23. The AD conversion circuit according to claim 21, wherein the potential of the ramp signal that changes from the first potential to the second potential in the comparison is equal to that potential of the ramp signal in the resetting of the comparator.

24. The AD conversion circuit according to claim 19, wherein the AD conversion circuit performs a plurality of the AD conversions, and
wherein in the comparison for each of the plurality of AD conversions, during the change of the potential of the ramp signal from the first potential to the third potential, the potential of the ramp signal changes at the first change rate and then changes at the second change rate.

25. The AD conversion circuit according to claim 24, wherein the plurality of AD conversions convert the analog signals having different values into respective digital signals.

26. The AD conversion circuit according to claim 25, wherein a period from a time when the potential of the ramp signal starts to change from the first potential to a time when a change rate of the potential of the ramp signal changes from the first change rate to the second change rate is a same length in the plurality of AD conversions.

27. The AD conversion circuit according to claim 24, wherein a period from a time when the potential of the ramp signal starts to change from the first potential to a time when a change rate of the potential of the ramp signal changes from the first change rate to the second change rate is a same length in the plurality of AD conversions.

28. The AD conversion circuit according to claim 24, wherein the potential of the ramp signal that changes from the first potential to the second potential is a same potential in the plurality of AD conversions.

29. The AD conversion circuit according to claim 19, further comprising:
a ramp signal generation circuit configured to generate the ramp signal;
a counter configured to count pulse signals to generate a count signal; and
a synchronous circuit,
wherein the synchronous circuit outputs a control signal to the ramp signal generation circuit and outputs the pulse signals to the counter.

30. The AD conversion circuit according to claim 29, wherein the control signal is a signal for changing a change rate of the potential of the ramp signal from the first change rate to the second change rate.

31. The AD conversion circuit according to claim 29,
wherein the synchronous circuit includes a first flip-flop circuit configured to generate the control signal and including a first clock terminal, and a second flip-flop circuit configured to generate the pulse signals and including a second clock terminal, and
wherein a common signal is input to each of the first clock terminal and the second clock terminal.

32. The AD conversion circuit according to claim 19,
wherein the potential of the ramp signal is changed by causing a capacitive element to charge with a current or discharge, and
wherein the first change rate and the second change rate are changed by changing a value of the current.

33. The AD conversion circuit according to claim 19, further comprising:
a first capacitive element; and
a second capacitive element,
wherein the comparator includes a first input terminal and a second input terminal,
wherein the analog signal is input to the first input terminal through the first capacitive element,
wherein the ramp signal is input to the second input terminal through the second capacitive element, and
wherein the resetting of the comparator is an operation for resetting charges of the first capacitive element and the second capacitive element.

34. A photoelectric conversion apparatus comprising:
the AD conversion circuit according to claim 19; and
an analog signal output unit configured to generate a charge based on incident light and output a signal based on the charge as the analog signal.

35. A photoelectric conversion system comprising:
the photoelectric conversion apparatus according to claim 34; and an image generation unit configured to generate an image using the digital signal output from the photoelectric conversion apparatus.

36. A moving body comprising:

the photoelectric conversion apparatus according to claim 34; and a distance information acquisition unit configured to acquire distance information about a distance to a target object from a parallax image based on a signal output from the photoelectric conversion apparatus, wherein the moving body further comprises a control unit configured to control the moving body based on the distance information.

\* \* \* \* \*